US012727279B2

(12) United States Patent
Ma

(10) Patent No.: US 12,727,279 B2
(45) Date of Patent: Sep. 1, 2026

(54) SOLAR CELL AND MANUFACTURING METHOD THEREFOR

(71) Applicant: LONGI SOLAR TECHNOLOGY (XI'AN) CO., LTD., Chang'an (CN)

(72) Inventor: Zhijie Ma, Taizhou (CN)

(73) Assignee: LONGI SOLAR TECHNOLOGY (XI'AN) CO., LTD., Shaanxi (CN)

( * ) Notice: Subject to any disclaimer, the term of this patent is extended or adjusted under 35 U.S.C. 154(b) by 420 days.

(21) Appl. No.: 18/574,245

(22) PCT Filed: Jan. 18, 2022

(86) PCT No.: PCT/CN2022/072560
§ 371 (c)(1),
(2) Date: Dec. 26, 2023

(87) PCT Pub. No.: WO2023/273313
PCT Pub. Date: Jan. 5, 2023

(65) Prior Publication Data

US 2024/0322066 A1 Sep. 26, 2024

(30) Foreign Application Priority Data

Jun. 28, 2021 (CN) ........................ 202110718685.3

(51) Int. Cl.
*H01L 31/18* (2006.01)
*H10F 71/00* (2025.01)
*H10F 77/30* (2025.01)

(52) U.S. Cl.
CPC ......... *H10F 71/129* (2025.01); *H10F 77/315* (2025.01)

(58) Field of Classification Search
CPC ........ H10K 59/122; G09F 9/30; H05B 33/12; H01B 33/22
See application file for complete search history.

(56) References Cited

U.S. PATENT DOCUMENTS

2010/0229934 A1* 9/2010 Jang .................... H10F 77/1692 257/E31.124
2010/0320091 A1* 12/2010 Takaki .................... C01G 9/02 205/412

(Continued)

FOREIGN PATENT DOCUMENTS

CN 104733555 A 6/2015
CN 109935659 A 6/2019

(Continued)

OTHER PUBLICATIONS

International Search Report for Application No. PCT/CN2022/072560, mailed Mar. 28, 2022 (4 pages).

(Continued)

*Primary Examiner* — Thao P Le
(74) *Attorney, Agent, or Firm* — NIXON PEABODY LLP; Jeffrey L. Costellia

(57) ABSTRACT

A manufacturing method of a solar cell includes: performing a boron-diffusion treatment to one surface in a first direction of an N-type silicon wafer, and forming a diffusion layer and a borosilicate-glass layer; by using a chain-type rinsing device, sequentially removing a winding-plated borosilicate-glass layer and a winding-plated diffusion layer winding-plated onto the N-type silicon wafer, and performing a polishing treatment to the surface in the second direction of the N-type silicon wafer; by using a passivation-contacting process, treating the surface in the second direction of the N-type silicon wafer, to form a tunneling oxidation layer, a doped silicon layer and a first phosphorosilicate-glass layer; by using the chain-type rinsing device, removing a second phosphorosilicate-glass layer and a winding-plated silicon layer winding-plated onto at least part of the borosilicate-glass layer; and, by using the same chain-type rinsing (Continued)

device, removing the borosilicate-glass layer and the first phosphorosilicate-glass layer.

20 Claims, 7 Drawing Sheets

(56) References Cited

U.S. PATENT DOCUMENTS

| | | | | |
|---|---|---|---|---|
| 2012/0167938 | A1* | 7/2012 | Fan | H10F 77/315 257/E31.011 |
| 2013/0133715 | A1* | 5/2013 | Jin | H10F 19/10 136/259 |
| 2014/0251817 | A1* | 9/2014 | Vais | H10F 77/311 257/734 |
| 2018/0166603 | A1* | 6/2018 | Kakkad | H10F 71/131 |

FOREIGN PATENT DOCUMENTS

| | | | |
|---|---|---|---|
| CN | 109962126 | A | 7/2019 |
| CN | 110571309 | A | 12/2019 |
| CN | 111341881 | A | 6/2020 |
| CN | 111509089 | A | 8/2020 |
| CN | 111653650 | A | 9/2020 |
| CN | 111883614 | A | 11/2020 |
| CN | 111900214 | A | 11/2020 |
| CN | 112599618 | A | 4/2021 |
| CN | 113488384 | A | 10/2021 |
| JP | 201422563 | A | 2/2014 |
| WO | 2016112757 | A1 | 7/2016 |

OTHER PUBLICATIONS

Chinese Office Action for Application No. 202110718685.3, mailed Apr. 28, 2022 (6 pages).

Extended European Search Report for EP Application No. EP22831149.4-1002, dated May 27, 2025, (11 pages).

* cited by examiner performing a boron-diffusion treatment to one surface in a first direction of an N-type silicon wafer, forming a diffusion layer and a borosilicate-glass layer that are sequentially stacked on the surface in the first direction of the N-type silicon wafer, and forming a winding-plated diffusion layer and a winding-plated borosilicate-glass layer on a side surface and one surface in a second direction of the N-type silicon wafer

↓ by using a chain-type rinsing device, performing a first corroding and rinsing treatment to the side surface and the surface in the second direction of the N-type silicon wafer after the boron-diffusion treatment, to sequentially remove the winding-plated borosilicate-glass layer and the winding-plated diffusion layer, and performing a polishing treatment to the surface in the second direction of the N-type silicon wafer

↓ by using a passivation-contacting process, treating the surface in the second direction of the N-type silicon wafer, to form a tunneling oxidation layer, a doped silicon layer and a first phosphorosilicate-glass layer that are sequentially stacked on the surface in the second direction of the N-type silicon wafer, and forming a winding-plated silicon layer and a second phosphorosilicate-glass layer on at least part of the borosilicate-glass layer

↓ by using the chain-type rinsing device, performing a second corroding and rinsing treatment to the surface in the first direction of the N-type silicon wafer that is treated by using the passivation-contacting process, to sequentially remove the second phosphorosilicate-glass layer and the winding-plated silicon layer

↓ by using the same chain-type rinsing device, performing a third corroding and rinsing treatment to the surface in the first direction and the surface in the second direction of the N-type silicon wafer after the second corroding and rinsing treatment, to remove the borosilicate-glass layer and the first phosphorosilicate-glass layer

FIG. 1

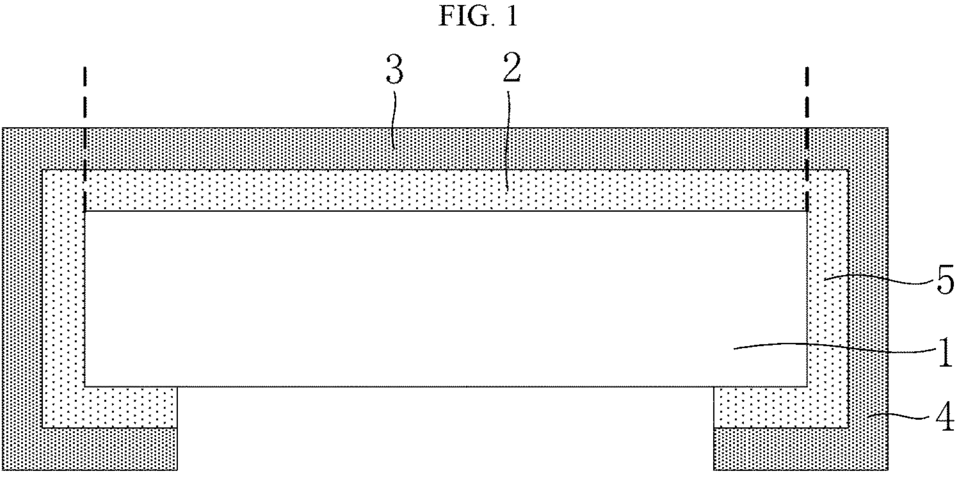

FIG. 2

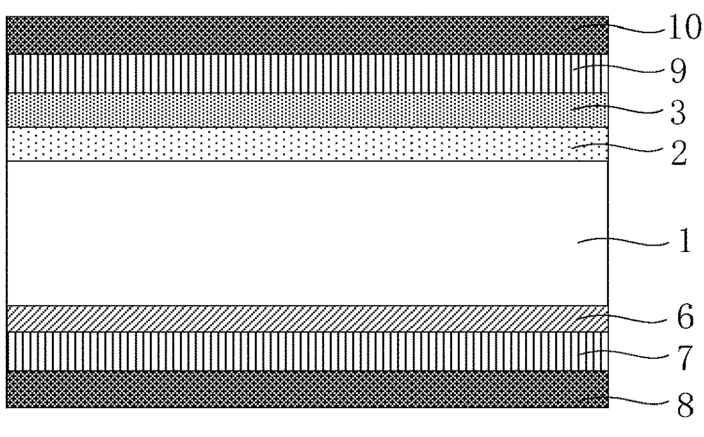
FIG. 9
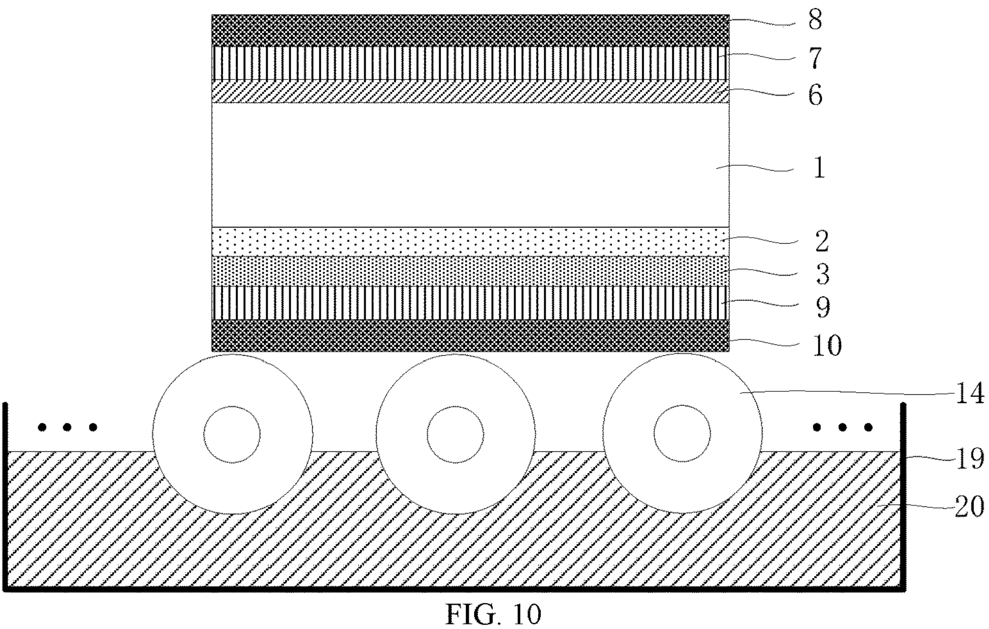
FIG. 10
FIG. 11

SOLAR CELL AND MANUFACTURING METHOD THEREFOR

CROSS REFERENCE TO RELEVANT APPLICATIONS

The present disclosure claims the priority of the Chinese patent application filed on Jun. 28, 2021 before the China National Intellectual Property Administration with the application number of 202110718685.3 and the title of "SOLAR CELL AND MANUFACTURING METHOD THEREFOR", which is incorporated herein in its entirety by reference.

TECHNICAL FIELD

The present disclosure relates to the technical field of solar cells, and particularly relates to a solar cell and a manufacturing method thereof.

BACKGROUND

In the process of manufacturing solar cells by using a technique of passivation contacting, after a boron-diffusion treatment is performed to the front surface of an N-type silicon wafer, an oxidation layer and a silicon layer (for example, an amorphous-silicon layer or polycrystalline-silicon layer) are formed sequentially at the back surface of the N-type silicon wafer. At this point, a winding-plated silicon layer is easily formed by winding plating on the borosilicate-glass layer located at the front surface of the N-type silicon wafer. Subsequently, after a phosphorous-diffusion treatment is performed to the back surface of the N-type silicon wafer, it causes that both of the silicon layer located at the back surface of the N-type silicon wafer and the winding-plated silicon layer located at the front surface of the N-type silicon wafer are doped by phosphorus. Furthermore, a phosphorosilicate-glass layer is formed on both of the silicon layer and the winding-plated silicon layer that are doped by phosphorus. Based on that, it is required to remove the phosphorosilicate-glass layer, the winding-plated silicon layer and the borosilicate-glass layer that are located at the front surface of the N-type silicon wafer, and remove the phosphorosilicate-glass layer located at the back surface of the N-type silicon wafer, to obtain the solar cell.

However, the removal of the phosphorosilicate-glass layer, the winding-plated silicon layer and the borosilicate-glass layer that are located at the front surface of the N-type silicon wafer and the phosphorosilicate-glass layer located at the back surface of the N-type silicon wafer using conventional methods requires spending a long time, which reduces the manufacturing efficiency of the solar cell.

SUMMARY

An object of the present disclosure is to provide a solar cell and a manufacturing method thereof, which is used to remove the second phosphorosilicate-glass layer, the winding-plated silicon layer, the borosilicate-glass layer and the first phosphorosilicate-glass layer by using the same chain-type rinsing device, to reduce the time spent on the second corroding and rinsing treatment and the third corroding and rinsing treatment, to increase the manufacturing efficiency of the solar cell.

In the first aspect, the present disclosure provides a manufacturing method of a solar cell, wherein the manufacturing method of the solar cell includes:

performing a boron-diffusion treatment to one surface in a first direction of an N-type silicon wafer, forming a diffusion layer and a borosilicate-glass layer that are sequentially stacked on the surface in the first direction of the N-type silicon wafer, and forming a winding-plated diffusion layer and a winding-plated borosilicate-glass layer on a side surface and one surface in a second direction of the N-type silicon wafer;

by using a chain-type rinsing device, performing a first corroding and rinsing treatment to the side surface and the surface in the second direction of the N-type silicon wafer after the boron-diffusion treatment, to sequentially remove the winding-plated borosilicate-glass layer and the winding-plated diffusion layer, and performing a polishing treatment to the surface in the second direction of the N-type silicon wafer;

by using a passivation-contacting process, treating the surface in the second direction of the N-type silicon wafer, to form a tunneling oxidation layer, a doped silicon layer and a first phosphorosilicate-glass layer that are sequentially stacked on the surface in the second direction of the N-type silicon wafer, and forming a winding-plated silicon layer and a second phosphorosilicate-glass layer on at least part of the borosilicate-glass layer;

by using the chain-type rinsing device, performing a second corroding and rinsing treatment to the surface in the first direction of the N-type silicon wafer that is treated by using the passivation-contacting process, to sequentially remove the second phosphorosilicate-glass layer and the winding-plated silicon layer; and by using the same chain-type rinsing device, performing a third corroding and rinsing treatment to the surface in the first direction and the surface in the second direction of the N-type silicon wafer after the second corroding and rinsing treatment, to remove the borosilicate-glass layer and the first phosphorosilicate-glass layer.

When the above technical solution is employed, after the step of performing the boron-diffusion treatment to the surface in the first direction of the N-type silicon wafer, not only the diffusion layer and the borosilicate-glass layer that are sequentially stacked are formed on the surface in the first direction of the N-type silicon wafer, but also the winding-plated diffusion layer and the winding-plated borosilicate-glass layer are formed by winding plating on at least part of the area of the surface in the second direction of the N-type silicon wafer and the side surface of the N-type silicon wafer. Furthermore, by performing the first corroding and rinsing treatment to the side surface and the surface in the second direction of the N-type silicon wafer after the boron-diffusion treatment, to sequentially remove the winding-plated borosilicate-glass layer and the winding-plated diffusion layer winding-plated onto the N-type silicon wafer, short circuiting between the upper electrode and the lower electrode of the manufactured solar cell via the winding-plated diffusion layer can be prevented, to improve the operation stability of the solar cell. Furthermore, after the first corrosion and rinsing is performed, the polishing treatment is performed to the surface in the second direction of the N-type silicon wafer, whereby the roughness of the surface in the second direction of the N-type silicon wafer can be reduced, and therefore the reflectivity to light rays by the surface in the second direction of the N-type silicon wafer can be increased, whereby the reflected light rays can have the photoelectric effect inside the N-type silicon wafer to generate more photo-induced electrons, which can increase the utilization ratio of the light energy by the solar cell.

Moreover, both of the first corroding and rinsing treatment and the polishing treatment are performed in the same chain-type rinsing device. Furthermore, subsequently, after the treatment using the passivation-contacting process, the removal of the second phosphorosilicate-glass layer, the winding-plated silicon layer, the borosilicate-glass layer and the first phosphorosilicate-glass layer that are formed by winding plating or diffusion is also performed in the same chain-type rinsing device. In other words, it is not required to transfer the N-type silicon wafer that is correspondingly treated between different rinsing devices, which can reduce the time wasted on transferring, to increase the manufacturing efficiency of the solar cell. In another aspect, that can prevent damage on the N-type silicon wafer caused by transferring devices provided between the different rinsing devices by factors such as bumping or friction, and prevent that, during the transferring, the N-type silicon wafer stays in the external environment for a long time and thus reacts with the air to cause the N-type silicon wafer to be polluted, which can finally increase the yield of the manufactured solar cell.

In an alternative implementation, the step of, by using the chain-type rinsing device, performing the first corroding and rinsing treatment to the side surface and the surface in the second direction of the N-type silicon wafer after the boron-diffusion treatment, to sequentially remove the winding-plated borosilicate-glass layer and the winding-plated diffusion layer, and performing the polishing treatment to the surface in the second direction of the N-type silicon wafer includes:

- contacting the surface in the second direction of the N-type silicon wafer after the boron-diffusion treatment with transfer rollers included by the chain-type rinsing device;
- conveying the N-type silicon wafer after the boron-diffusion treatment to a pickling bath included by the chain-type rinsing device by using the transfer rollers, wherein a liquid level of an acidic rinsing solution located in the pickling bath is higher than the surface in the second direction of the N-type silicon wafer, and lower than the surface in the first direction of the N-type silicon wafer, and removing the winding-plated borosilicate-glass layer by using the acidic rinsing solution; and
- by using the transfer rollers, conveying the N-type silicon wafer that is treated by using the acidic rinsing solution to an alkaline-rinsing bath included by the chain-type rinsing device, wherein a liquid level of an alkaline rinsing solution located in the alkaline-rinsing bath is higher than the surface in the second direction of the N-type silicon wafer, and lower than the surface in the first direction of the N-type silicon wafer, and, by using the alkaline rinsing solution, removing the winding-plated diffusion layer, and performing the polishing treatment to the surface in the second direction of the N-type silicon wafer.

When the above technical solution is employed, the surface in the second direction of the N-type silicon wafer after the boron-diffusion treatment faces the transfer rollers. Based on that, after the N-type silicon wafer after the boron-diffusion treatment is conveyed to the pickling bath by using the transfer rollers, the winding-plated borosilicate-glass layer formed due to the winding plating can contact and react with the acidic rinsing solution in the pickling bath, so as to remove the winding-plated borosilicate-glass layer by using the acidic rinsing solution, and cause the winding-plated diffusion layer to be exposed. Furthermore, the liquid level of the acidic rinsing solution is lower than the surface in the first direction of the N-type silicon wafer, and therefore the diffusion layer and the borosilicate-glass layer located on the surface in the first direction of the N-type silicon wafer cannot contact the acidic rinsing solution, whereby, after the treatment using the acidic rinsing solution, the diffusion layer and the borosilicate-glass layer can be maintained, to enable the borosilicate-glass layer to serve as a mask for the subsequent treatments, to prevent the diffusion layer and the surface in the first direction of the N-type silicon wafer from being influenced by the subsequent treatments such as corrosion and rinsing, to increase the yield of the solar cell. Moreover, after the N-type silicon wafer that is treated by using the acidic rinsing solution is conveyed to the alkaline-rinsing bath by using the transfer rollers, the exposed winding-plated diffusion layer can contact and react with the alkaline rinsing solution in the alkaline-rinsing bath, so as to remove the winding-plated diffusion layer by using the alkaline rinsing solution, and enable the side surface and the surface in the second direction of the N-type silicon wafer to be exposed. Subsequently, by using the alkaline rinsing solution, the polishing treatment can be performed to the surface in the second direction of the N-type silicon wafer that is exposed. As compared with polishing treatment using the acidic rinsing solution, after polishing by using the alkaline rinsing solution, the reflectivity to light rays by the surface in the second direction of the N-type silicon wafer can be increased from 30% to above 45%, so that the surface in the second direction of the N-type silicon wafer can reflect more light rays into the N-type silicon wafer, which can further increase the utilization ratio of the light energy by the solar cell.

In an alternative implementation, after the step of performing the polishing treatment to the surface in the second direction of the N-type silicon wafer, and before the step of, by using the passivation-contacting process, treating the surface in the second direction of the N-type silicon wafer, the manufacturing method of the solar cell further includes:

- in a first water-rinsing bath included by the chain-type rinsing device, spraying deionized water to the surface in the first direction and the surface in the second direction of the N-type silicon wafer after the polishing treatment, and performing a first rinsing treatment to the N-type silicon wafer after the polishing treatment.

When the above technical solution is employed, after the polishing treatment to the surface in the second direction of the N-type silicon wafer, at least on the surface in the second direction of the N-type silicon wafer the corresponding rinsing solution remains. Based on that, before the step of, by using the passivation-contacting process, treating the surface in the second direction of the N-type silicon wafer, deionized water is sprayed to the surface in the first direction and the surface in the second direction of the N-type silicon wafer in the first water-rinsing bath, to rinse off the whole of the residual rinsing solution on the N-type silicon wafer, to prevent the rinsing solution from influencing the formation of the film layers such as the N-type silicon wafer and the tunneling oxidation layer, to increase the yield of the manufactured solar cell.

In an alternative implementation, the step of, by using the chain-type rinsing device, performing the second corroding and rinsing treatment to the surface in the first direction of the N-type silicon wafer that is treated by using the passivation-contacting process, to sequentially remove the second phosphorosilicate-glass layer and the winding-plated silicon layer includes:

contacting the surface in the first direction of the N-type silicon wafer that is treated by using the passivation-contacting process with transfer rollers included by the chain-type rinsing device;

spreading a water film fully on the surface in the second direction of the N-type silicon wafer that is treated by using the passivation-contacting process, and, by using a first rinsing solution, removing the second phosphorosilicate-glass layer by using a roller-carrying-liquid rinsing mode; and by using the transfer rollers, placing the N-type silicon wafer that is treated by using the first rinsing solution into a second rinsing solution, wherein a liquid level of the second rinsing solution is higher than the surface in the first direction of the N-type silicon wafer, and removing the winding-plated silicon layer by using the second rinsing solution.

When the above technical solution is employed, the surface in the first direction of the N-type silicon wafer that is treated by using the passivation-contacting process faces the transfer rollers. At this point, the second phosphorosilicate-glass layer located on the outermost side of the surface in the first direction contacts the transfer rollers. Based on that, during the rotation of the transfer rollers, the first rinsing solution contacting the transfer rollers can be brought by the centripetal force to the second phosphorosilicate-glass layer, and react with the second phosphorosilicate-glass layer, to realize, by using the first rinsing solution, removing the second phosphorosilicate-glass layer by using the roller-carrying-liquid rinsing mode. Moreover, in the process of removing the second phosphorosilicate-glass layer, because the surface in the second direction of the N-type silicon wafer that is treated by using the passivation-contacting process faces upwardly, and is spread fully with a water film, at this point, even if the transfer rollers can bring the first rinsing solution to the surface in the second direction of the N-type silicon wafer, it does not react with the first phosphorosilicate-glass layer located on the outermost side of the surface in the second direction, whereby the first phosphorosilicate-glass layer can be maintained, and, accordingly, in the subsequent process of removing the winding-plated silicon layer, the first phosphorosilicate-glass layer can serve as the mask for protecting the doped silicon layer, to prevent the doped silicon layer from being influenced by the second rinsing solution in the subsequent process of removing the winding-plated silicon layer, to increase the yield of the manufactured solar cell. Moreover, after the second phosphorosilicate-glass layer is removed, the winding-plated silicon layer that was originally joined to the second phosphorosilicate-glass layer is exposed, and contacts the transfer rollers. Based on that, with the conveying by the transfer rollers, after the N-type silicon wafer that is treated by using the first rinsing solution is placed into the second rinsing solution, because the liquid level of the second rinsing solution is higher than the surface in the first direction of the N-type silicon wafer, the winding-plated silicon layer is submerged inside the second rinsing solution, so as to remove the winding-plated silicon layer by using the second rinsing solution, to increase the manufacturing efficiency of the solar cell.

In an alternative implementation, the second rinsing solution includes deionized water, a potassium-hydroxide solution and a polishing additive. A volume ratio of the deionized water, the potassium-hydroxide solution and the polishing additive is 30-40:3-4:1. A concentration of the potassium-hydroxide solution is 40%-50%. A rinsing temperature is 69° C.-70° ° C.; and a rinsing duration is 135 s-150 s.

When the above technical solution is employed, the deionized water refers to pure water from which the impurities in the ionic form are removed. Based on that, if the second rinsing solution includes the deionized water, the potassium-hydroxide solution and the polishing additive, the ions in the potassium-hydroxide solution do not bind with ions in the deionized water, whereby the reaction between the corresponding ions in the potassium-hydroxide solution and the winding-plated silicon layer is not influenced, to ensure the effect of reaction, which can increase the yield of the manufactured solar cell. Moreover, the polishing additive can increase the transverse etching speed of the potassium-hydroxide solution, and reduce the longitudinal etching speed of the potassium-hydroxide solution, thereby preventing sueding on the surface in the first direction of the N-type silicon wafer in the process of removing the winding-plated silicon layer, to realize the complete removal of the winding-plated silicon layer, to increase the fabrication yield of the solar cell.

In an alternative implementation, the step of, by using the chain-type rinsing device, removing the winding-plated silicon layer further includes:

in a process of removing the winding-plated silicon layer by using the second rinsing solution, supplementing at least one of the deionized water, the potassium-hydroxide solution and the polishing additive into the second rinsing solution, to cause the volume ratio of the deionized water, the potassium-hydroxide solution and the polishing additive in the second rinsing solution to satisfy 30-40:3-4:1.

When the above technical solution is employed, because, when the winding-plated silicon layer is removed by using the second rinsing solution, the rinsing temperature is 69° C.-70° C., which is a high temperature, and the traditional chain-type rinsing devices are an open-type rinsing device or a rinsing device provided with a cover plate, at the high rinsing temperature, the deionized-water solution in the second rinsing solution evaporates into the environment or stays on the cover plate, which causes that the volume ratio of the deionized water, the potassium-hydroxide solution and the polishing additive in the second rinsing solution varies. However, by supplementing into the second rinsing solution the deionized water that is lost by evaporation during the rinsing, it can be ensured that, in the rinsing process, the volume ratio of the deionized water, the potassium-hydroxide solution and the polishing additive satisfies the requirement, which can ensure the effect of reaction, to increase the yield of the manufactured solar cell. Moreover, in the practical applications, the solar cells are manufactured in bulk, to increase the manufacturing efficiency. Based on that, by supplementing into the second rinsing solution at least one of the deionized water during the rinsing, the potassium-hydroxide solution and the polishing additive, it can be ensured that, in the batch fabrication, the volume ratio of the deionized water, the potassium-hydroxide solution and the polishing additive in the second rinsing solution satisfies the requirement, which can ensure the effect of rinsing while increasing the manufacturing efficiency.

In an alternative implementation, the step of, by using the same chain-type rinsing device, removing the borosilicate-glass layer includes:

placing the surface in the first direction of the N-type silicon wafer after the second corroding and rinsing treatment into a third rinsing solution, wherein a liquid level of the third rinsing solution is higher than the surface in the first direction of the N-type silicon wafer, and removing the borosilicate-glass layer by using the third rinsing solution.

The step of, by using the same chain-type rinsing device, removing the first phosphorosilicate-glass layer includes:

placing the surface in the second direction of the N-type silicon wafer after the second corroding and rinsing treatment into a fourth rinsing solution, wherein a liquid level of the fourth rinsing solution is higher than the surface in the second direction of the N-type silicon wafer, and removing the first phosphorosilicate-glass layer by using the fourth rinsing solution.

When the above technical solution is employed, the surface in the first direction of the N-type silicon wafer after the second corroding and rinsing treatment is placed into the third rinsing solution or the surface in the second direction is placed into the fourth rinsing solution, to correspondingly remove the borosilicate-glass layer and the first phosphorosilicate-glass layer, to realize removing the corresponding film layers in the different rinsing solutions in the same chain-type rinsing device by inversely placing the N-type silicon wafer, without transferring the N-type silicon wafer that is correspondingly treated into different rinsing devices, to increase the manufacturing efficiency. Moreover, because, after the winding-plated silicon layer whose one face located in the first direction is removed, the borosilicate-glass layer joined to the winding-plated silicon layer is exposed, and contacts the transfer rollers, based on that, as compared with the two inverse-placing operations that the N-type silicon wafer is required to undergo when the first phosphorosilicate-glass layer is firstly removed and the winding-plated silicon layer is subsequently removed, after the winding-plated silicon layer is removed, the surface in the first direction of the N-type silicon wafer that is treated by using the second rinsing solution is directly placed into the third rinsing solution by the transfer rollers to firstly remove the borosilicate-glass layer. In this case, it is merely required that, after the borosilicate-glass layer is removed, one time of the inverse-placing operation is performed to the N-type silicon wafer, and the removal of the borosilicate-glass layer and the first phosphorosilicate-glass layer can be completed, which can reduce the time quantity of the inverse placing of the N-type silicon wafer, and reduce the risk in damaging the N-type silicon wafer by the device performing the inverse-placing operation, to increase the manufacturing efficiency of the solar cell while increasing its fabrication yield.

In an alternative implementation, the chain-type rinsing device includes a first rinsing tank, a second rinsing tank, a third rinsing tank and a fourth rinsing tank that are sequentially arranged, and a plurality of transfer rollers for conveying;

the first rinsing tank is used to contain a first rinsing liquid for removing the second phosphorosilicate-glass layer, a diameter of the transfer rollers that are provided over the first rinsing tank is H1, and a distance between a liquid level of the first rinsing solution and a bottom of the transfer rollers that are provided over the first rinsing tank is H2, wherein $\frac{1}{3}$H1≤H2≤$\frac{1}{2}$ H1;

the second rinsing tank is used to contain the second rinsing solution for removing the winding-plated silicon layer, and the transfer rollers that are provided over the second rinsing tank are submerged inside the second rinsing solution; and the third rinsing tank is used to contain the third rinsing solution for removing the borosilicate-glass layer, the transfer rollers that are provided over the third rinsing tank are submerged inside the third rinsing solution, the fourth rinsing tank is used to contain the fourth rinsing solution for removing the first phosphorosilicate-glass layer, and the transfer rollers that are provided over the fourth rinsing tank are submerged inside the fourth rinsing solution; or the third rinsing tank is used to contain the fourth rinsing solution for removing the first phosphorosilicate-glass layer, the transfer rollers that are provided over the third rinsing tank are submerged inside the fourth rinsing solution, the fourth rinsing tank is used to contain the third rinsing solution for removing the borosilicate-glass layer, and the transfer rollers that are provided over the fourth rinsing tank are submerged inside the third rinsing solution.

When the above technical solution is employed, the chain-type rinsing device includes a first rinsing tank, a second rinsing tank, a third rinsing tank and a fourth rinsing tank that are sequentially arranged, the corresponding rinsing tanks contain the rinsing liquids for removing the corresponding film layers, and the transfer rollers provided over the corresponding rinsing tanks are partially or wholly located in the corresponding rinsing solutions. Based on that, by using the chain-type rinsing device, the N-type silicon wafer that is treated by using the passivation-contacting process can sequentially undergo the second corroding and rinsing treatment and the third corroding and rinsing treatment. In other words, not only the second corroding and rinsing treatment and the third corroding and rinsing treatment can be completed in the same chain-type rinsing device, without transferring it between different rinsing devices, but also the corresponding film layers can be removed continuously by using the corresponding rinsing tanks that are sequentially arranged of the chain-type rinsing device, which can reduce the duration of the transferring in the same chain-type rinsing device, to further increase the manufacturing efficiency of the solar cell.

In an alternative implementation, the chain-type rinsing device further includes a second water-rinsing bath for performing a second rinsing treatment; the second water-rinsing bath is provided between the second rinsing tank and the third rinsing tank; and after the step of, by using the chain-type rinsing device, removing the winding-plated silicon layer, and before the step of, by using the same chain-type rinsing device, removing the borosilicate-glass layer, the manufacturing method of the solar cell further includes:

in the second water-rinsing bath, spraying deionized water to the surface in the first direction and the surface in the second direction of the N-type silicon wafer after the second corroding and rinsing treatment, to perform the second rinsing treatment to the N-type silicon wafer after the second corroding and rinsing treatment.

When the above technical solution is employed, after the winding-plated silicon layer is removed by using the second rinsing solution in the second rinsing tank, on the surface of the N-type silicon wafer that is treated by using the second rinsing solution the second rinsing solution remains. Based on that, before the borosilicate-glass layer or the first phosphorosilicate-glass layer is removed by using the corresponding rinsing solutions in the third rinsing tank, the second rinsing treatment is performed to the N-type silicon wafer that is treated by using the second rinsing solution by using the second water-rinsing bath provided between the second rinsing tank and the third rinsing tank, to remove the whole of the residual second rinsing solution by using the deionized water, which can prevent the second rinsing solution from affecting the effect of rinsing of the corresponding rinsing solutions, to increase the yield of the solar cell.

In an alternative implementation, after the step of, by using the same chain-type rinsing device, performing the third corroding and rinsing treatment to the surface in the first direction and the surface in the second direction of the N-type silicon wafer after the second corroding and rinsing treatment, to remove the borosilicate-glass layer and the first phosphorosilicate-glass layer, the manufacturing method of the solar cell further includes:

- forming a first passivation layer on the diffusion layer;
- performing a passivation treatment to the first passivation layer and the doped silicon layer, to form second passivation layers on both of the first passivation layer and the doped silicon layer, wherein a material of the second passivation layers and a material of the first passivation layer are different; and
- performing a metallization treatment to each of the second passivation layers, to form electrodes on the second passivation layers.

When the above technical solution is employed, the first passivation layer and the second passivation layers that are stacked are formed sequentially on the diffusion layer, to reduce the recombination rate of the surface in the first direction of the N-type silicon wafer after the passivation treatment, so that more majority carriers can be collected by the corresponding electrodes on the surface in the first direction of the N-type silicon wafer after the metallization treatment, to increase the photoelectric conversion efficiency of the solar cell. Likewise, the function of the second passivation layer formed on the doped silicon layer may refer to the function of the first passivation layer and the second passivation layer that are formed on the diffusion layer, and are not discussed further herein.

In the second aspect, the present disclosure further provides a solar cell, wherein the solar cell is manufactured by using the manufacturing method of the solar cell according to the first aspect or any one of the alternative implementations in the first aspect.

The advantageous effects of the second aspect of the present disclosure and the various implementations thereof may refer to the description on the advantageous effects of the first aspect and the various implementations thereof, and are not discussed further herein.

The above description is merely a summary of the technical solutions of the present disclosure. In order to more clearly know the elements of the present disclosure to enable the implementation according to the contents of the description, and in order to make the above and other purposes, features and advantages of the present disclosure more apparent and understandable, the particular embodiments of the present disclosure are provided below.

BRIEF DESCRIPTION OF THE DRAWINGS

The drawings illustrated herein are intended to provide a further understanding of the present disclosure, and form part of the present disclosure. The illustrative embodiments of the present disclosure and their explanation are intended to interpret the present disclosure, and do not inappropriately limit the present disclosure. In the drawings:

FIG. 1 is a flow chart of a manufacturing method of a solar cell according to an embodiment of the present disclosure;

FIG. 2 is a first schematic structural diagram after the boron-diffusion treatment to the surface in the first direction of the N-type silicon wafer according to an embodiment of the present disclosure;

FIG. 9 is a second schematic structural diagram after the treatment to the surface in the second direction of the N-type silicon wafer by using the passivation-contacting process according to an embodiment of the present disclosure;

FIG. 10 is a schematic structural diagram of the conveying of the N-type silicon wafer that is treated by using the passivation-contacting process to the first rinsing tank by using the transfer rollers according to an embodiment of the present disclosure;

FIG. 11 is a schematic structural diagram of the conveying of the N-type silicon wafer that is treated by using the first rinsing solution to the second rinsing tank by using the transfer rollers according to an embodiment of the present disclosure;

REFERENCE NUMBERS

Figure 3:
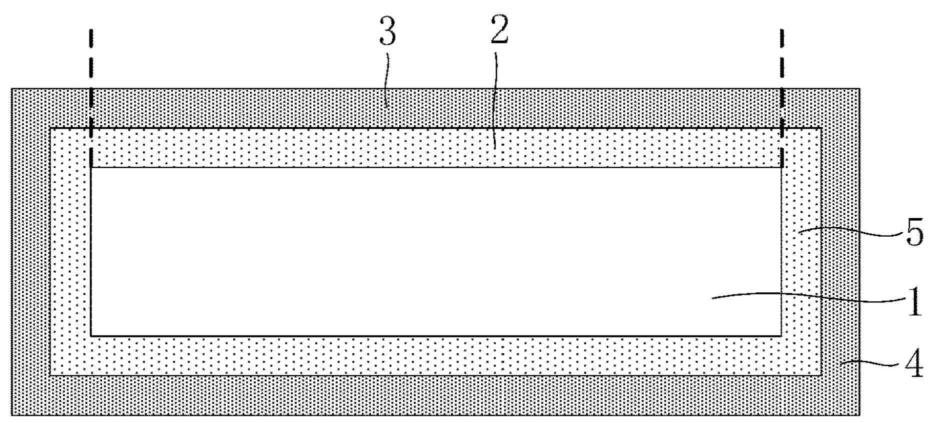
FIG. 3 is a second schematic structural diagram after the boron-diffusion treatment to the surface in the first direction of the N-type silicon wafer according to an embodiment of the present disclosure.

- 1 is the N-type silicon wafer, 2 is the diffusion layer, 3 is the borosilicate-glass layer,
- 4 is the winding-plated borosilicate-glass layer, 5 is the winding-plated diffusion layer, 6 is the tunneling oxidation layer,
- 7 is the doped silicon layer, 8 is the first phosphorosilicate-glass layer, 9 is the winding-plated silicon layer,
- 10 is the second phosphorosilicate-glass layer, 11 is the first passivation layer, 12 is the second passivation layer,
- 13 is the electrode, 14 is the transfer roller, 15 is the pickling bath,
- 16 is the acidic rinsing solution, 17 is the alkaline-rinsing bath, 18 is the alkaline rinsing solution,
- 19 is the first rinsing tank, 20 is the first rinsing solution, 21 is the second rinsing tank,
- 22 is the second rinsing solution, 23 is the third rinsing tank, 24 is the third rinsing solution,
- 25 is the fourth rinsing tank, and 26 is the fourth rinsing solution.

DETAILED DESCRIPTION

The embodiments of the present disclosure will be described below with reference to the drawings. However, it should be understood that the description is merely illustrative, and is not intended to limit the scope of the present disclosure. Moreover, in the following description, the description on well-known structures and techniques are omitted, in order to prevent unnecessary confusion of the concepts of the present disclosure.

The drawings illustrate various schematic structural diagrams according to the embodiments of the present disclosure. The figures are not pulled to scale, wherein in order for clear illustration, certain details are exaggerated, and certain details might be omitted. The shapes of the regions and the layers shown in the figures and the relative sizes and position relations therebetween are merely exemplary, and, in practice, they might have deviations due to manufacturing tolerances or technical restrictions. In addition, a person skilled in the art may design other regions and layers that have different shapes, sizes and relative positions according to practical demands.

In the context of the present disclosure, if a layer/element is described as located "over" another layer/element, the layer/element may be directly located over the another layer/element, or an intermediate layer/element may exist between them. In addition, if, with an orientation, a layer/element is located "over" another layer/element, then, when the orientation is turned, the layer/element may be located "under" the another layer/element. In order to make the technical problem sought to solve, the technical solutions and the advantageous effects of the present disclosure clearer, the present disclosure will be described in further detail below with reference to the drawings and the embodiments. It should be understood that the particular embodiments described herein are merely intended to interpret the present disclosure, and are not intended to limit the present disclosure.

Moreover, the terms "first" and "second" are merely for the purpose of describing, and should not be construed as indicating or implying the degrees of importance or implicitly indicating the quantity of the specified technical features. Accordingly, the features defined by "first" and "second" may explicitly or implicitly include one or more of the features. In the description of the present disclosure, the meaning of "plurality of" is "two or more", unless explicitly and particularly defined otherwise. The meaning of "several" is "one or more", unless explicitly and particularly defined otherwise.

In the description of the present disclosure, it should be noted that, unless explicitly defined or limited otherwise, the terms "mount", "connect" and "link" should be interpreted broadly. For example, it may be fixed connection, detachable connection, or integral connection; it may be mechanical connection or electrical connection; and it may be direct connection or indirect connection by an intermediate medium, and may be the internal communication between two elements or the interaction between two elements. For a person skilled in the art, the particular meanings of the above terms in the present disclosure may be comprehended according to particular situations.

The surface passivation of solar cells has always been extremely important in the design and optimization of solar cells. In the early stage the back-surface-field passivation is used, and, at present, passivation by introducing medium layers such as silicon oxide, aluminium oxide and silicon nitride into the back surface, passivation of local tapping contacting, emitter back-surface-field point contact (PERC)/passivation, and emitter back local diffusion (PERL) design, are used. Although the above-described PERC and PERL structures can reduce the back-surface electric recombination rate to a certain extent, they constraint the area of the contacting at the back surface within the tapping region, which not only increases the process complexity, but also results in etching damage on the silicon matrix during the tapping, thereby increasing the recombination rate within the region of metal contacting, to result in a low photoelectric conversion efficiency of the solar cells.

In order to solve the above technical problems, a person skilled in the art has developed the technique of passivation contacting. The technique does not require tapping at the back surface, and can realize whole-face passivation, which can reduce the recombination loss. The passivation-contacting structure will be introduced simply by taking the technique of passivation contacting of a tunneling oxidation layer as an example, which includes forming an ultra-thin silicon-oxide layer by using a chemical method at the back surface of the solar cell, and depositing a thin doped silicon layer on the ultra-thin silicon-oxide layer, wherein the two layers together form the passivation-contacting structure. Because the ultra-thin silicon-oxide layer of the passivation-contacting structure has a low thickness, and the thin doped silicon layer provides field passivation and has a permselectivity to the charge carriers, majority carriers can penetrate the two passivation layers, while minority carriers are blocked. Based on that, by forming metal electrodes on the passivation-contacting structure, passivation contacting without tapping can be obtained. In this case, the metal electrodes can collect the majority carriers that have penetrated the ultra-thin silicon-oxide layer and the thin doped silicon layer, but the minority carriers that are blocked inside the passivation-contacting structure cannot recombine with the majority carriers within the metal contacting region, which can reduce the recombination rate.

In the process of manufacturing the solar cell by using the technique of passivation contacting, taking the case as an example, in which the silicon wafer is an N-type silicon wafer, firstly a boron-diffusion treatment is performed to the front surface of the N-type silicon wafer, to form a P+ layer at the front surface of the N-type silicon wafer. At the same time, a borosilicate-glass layer is formed on the P+ layer. After the back blocks are removed, an oxidation layer is grown at the back surface of the N-type silicon wafer, and a silicon layer (for example, an amorphous-silicon layer or polycrystalline-silicon layer) is deposited on the oxidation layer. The silicon layer is very easily winding-plated to the front surface of the silicon wafer, thereby forming a winding-plated silicon layer on at least a part of the borosilicate-glass layer at the front surface. Subsequently, a phosphorous-diffusion treatment is performed to the back surface of the N-type silicon wafer, so as to form a doped silicon layer at the silicon layer at the back surface, and a phosphorosilicate-glass layer is formed on the doped silicon layer. Moreover, because the winding-plated silicon layer is formed at the front surface of the N-type silicon wafer, in the process of the phosphorous-diffusion treatment, phosphorous diffusion is performed to the winding-plated silicon layer, and the phosphorosilicate-glass layer is formed on it. In this case, in order to obtain the solar cell, it is required to remove the phosphorosilicate-glass layer, the winding-plated silicon layer and the borosilicate-glass layer that are located at the front surface of the N-type silicon wafer, and remove the phosphorosilicate-glass layer located at the back surface of the N-type silicon wafer. Particularly, in conventional methods, the removal of the film layers has three steps, which are the removal of the phosphorosilicate-glass layer at the front surface, the removal of the winding-plated silicon layer at the front surface and the removal of the phosphorosilicate-glass layer at the back surface and the borosilicate-glass layer at the front surface. Furthermore, it is required to rinse and remove the different to-be-removed film layers in different rinsing devices.

However, the transferring of the N-type silicon wafer that is formed with the corresponding film layers between the different rinsing devices does not only cost time and labor and reduce the manufacturing efficiency, but also results in pollution of the N-type silicon wafer because the N-type silicon wafer stays for an excessively long time in air, and results in damage on the N-type silicon wafer due to the problem of friction, bumping and so on between the N-type silicon wafer and the transferring devices, which affects the yield of the solar cell.

As shown in FIG. 1, in order to solve the above technical problems, an embodiment of the present disclosure provides a solar cell and a manufacturing method thereof. The manufacturing method of the solar cell according to the embodiments of the present disclosure will be described below according to the structural sectional views after the corresponding treatments shown in FIG. 2 to FIG. 19. Particularly, the manufacturing method of the solar cell include the following steps:

As shown in FIG. 2 and FIG. 3, a boron-diffusion treatment is performed to one face in a first direction of an N-type silicon wafer 1, a diffusion layer 2 and a borosilicate-glass layer 3 that are sequentially stacked are formed on the surface in the first direction of the N-type silicon wafer 1, and a winding-plated borosilicate-glass layer 4 and a winding-plated diffusion layer 5 are formed on the side surface and one face in a second direction of the N-type silicon wafer 1.

The surface in the first direction of the N-type silicon wafer may be the front surface of the N-type silicon wafer, and it is the same as the front surface of the solar cell. Correspondingly, the surface in the second direction of the N-type silicon wafer may be the back surface of the N-type silicon wafer, and it is the same as the back surface of the solar cell. Moreover, in terms of the structure, the N-type silicon wafer may be an N-type silicon wafer after a sueding treatment. In terms of the material, the N-type silicon wafer may be an N-type monocrystalline silicon wafer or an N-type polycrystalline silicon wafer. For example, the N-type silicon wafer may be an N-type monocrystalline silicon wafer, and one face in the first direction of it has a suede structure.

As an example, if the N-type silicon wafer is an N-type silicon wafer after a sueding treatment, the surface in the first direction of the N-type silicon wafer may be treated by using an alkaline solution, to form a suede structure of a pyramid morphology on the surface in the first direction of the N-type silicon wafer. The alkaline solution may be any alkaline solution that can realize the sueding treatment. For example, the alkaline solution may be a potassium-hydroxide solution, a sodium-hydroxide solution and so on. The suede structure may serve for light trapping, to reduce the reflection of light rays by the solar cell, so that more light rays can be refracted into the solar cell, to increase the utilization ratio of the light energy by the solar cell. Subsequently, the boron-diffusion treatment may be performed to the surface in the first direction of the N-type silicon wafer by using any one of a $BBr_3$ liquid-source diffusion process, an ion implantation process and a doping-source spread-coating pushing process. Particularly, as shown in FIG. 2 and FIG. 3, after the boron-diffusion treatment is performed to the surface in the first direction of the N-type silicon wafer 1, not only the diffusion layer 2 is formed on the surface in the first direction of the N-type silicon wafer 1, but also the winding-plated diffusion layer 5 is formed by winding plating on at least part of the area (that area is located at the edge of the surface in the second direction) of the surface in the second direction of the N-type silicon wafer 1 and the side surface of the N-type silicon wafer 1. For example, as shown in FIG. 2. The winding-plated diffusion layer 5 is formed on part of the area of the surface in the second direction of the N-type silicon wafer 1 and the side surface of the N-type silicon wafer 1. As another example, as shown in FIG. 3, the winding-plated diffusion layer 5 covers the whole of the area of the surface in the second direction of the N-type silicon wafer 1 and the side surface of the N-type silicon wafer 1. The area of the winding plating of the winding-plated diffusion layer on the surface in the second direction of the N-type silicon wafer is relevant to the process parameters that are set in the boron-diffusion treatment. For example, if the boron-diffusion treatment is performed by using the $BBr_3$ liquid-source diffusion process, the high gas flow rate and diffusion temperature cause that the area of the formation of the winding-plated diffusion layer on the surface in the second direction of the N-type silicon wafer increases. Moreover, in the process of the boron-diffusion treatment to the surface in the first direction of the N-type silicon wafer, not only the diffusion layer and the winding-plated diffusion layer are formed on the surface of the N-type silicon wafer, but also the borosilicate-glass layer is formed on the diffusion layer and the winding-plated borosilicate-glass layer is formed on the winding-plated diffusion layer.

It should be noted that, in some embodiments of the manufacturing method of the solar cell, the process step of the sueding may also be omitted. Moreover, the type of the doping of the diffusion layer and the winding-plated diffusion layer after the boron-diffusion treatment is the P+ type.

As shown in FIG. 4 to FIG. 7, by using a chain-type rinsing device, a first corroding and rinsing treatment is performed to the side surface and the surface in the second direction of the N-type silicon wafer 1 after the boron-diffusion treatment, to sequentially remove the winding-plated borosilicate-glass layer 4 and the winding-plated diffusion layer 5. Furthermore, the polishing treatment is performed to the surface in the second direction of the N-type silicon wafer 1.

Figure 19:
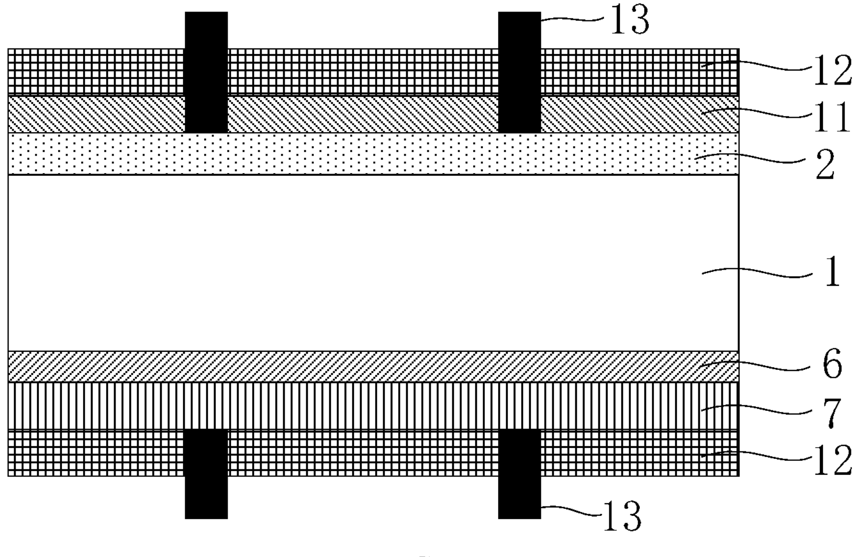
FIG. 19 is a schematic structural diagram after the formation of the electrodes according to an embodiment of the present disclosure.

It can be understood that, as shown in FIG. 19, the upper electrode and the lower electrode of the solar cell are located on the surface in the first direction and the surface in the second direction of the N-type silicon wafer 1 respectively. Furthermore, as shown in FIG. 2 and FIG. 3, after the boron-diffusion treatment, not only the diffusion layer 2 and the borosilicate-glass layer 3 are formed on the surface in the first direction of the N-type silicon wafer 1, but also the winding-plated diffusion layer 5 and the winding-plated borosilicate-glass layer 4 are formed by winding plating on at least part of the area (that area is located at the edge of the surface in the second direction) of the surface in the second direction of the N-type silicon wafer 1 and the side surface of the N-type silicon wafer 1. Based on that, the existence of the winding-plated diffusion layer 5 results in short circuiting between the upper electrode and the lower electrode of the solar cell. Therefore, before the subsequent treatments, the winding-plated borosilicate-glass layer 4 and the winding-plated diffusion layer 5 winding-plated onto the N-type silicon wafer 1 are sequentially removed, to improve the operation stability of the solar cell. Moreover, the surface in the second direction of the N-type silicon wafer 1 is the back surface of the solar cell. After the winding-plated diffusion layer 5 is removed, by the polishing treatment to the surface in the second direction of the N-type silicon wafer 1, the roughness of the surface in the second direction of the N-type silicon wafer 1 can be reduced, and therefore the reflectivity to light rays by the surface in the second direction of the N-type silicon wafer 1 can be increased, whereby the reflected light rays can have the photoelectric effect inside the N-type silicon wafer 1 to generate more photo-induced electrons, which can increase the utilization ratio of the light energy by the solar cell.

Figure 4:
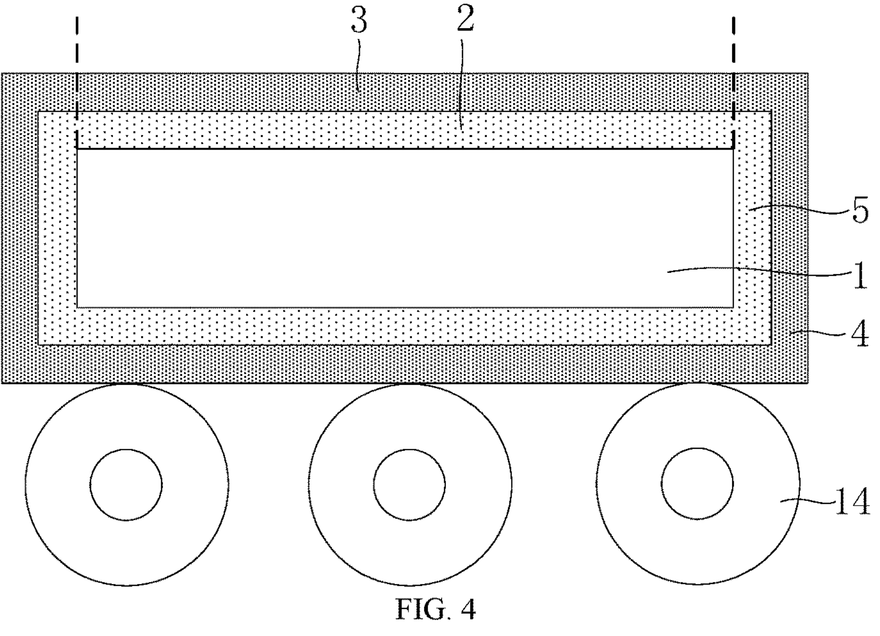
FIG. 4 is a schematic diagram of the position relation after the contacting between the surface in the second direction of the N-type silicon wafer after the boron-diffusion treatment and the transfer rollers according to an embodiment of the present disclosure.

As an example, the step of, by using the chain-type rinsing device, performing the first corroding and rinsing treatment to the side surface and the surface in the second direction of the N-type silicon wafer after the boron-diffusion treatment, to sequentially remove the winding-plated borosilicate-glass layer and the winding-plated diffusion layer, and performing the polishing treatment to the surface in the second direction of the N-type silicon wafer may include the following steps:

As shown in FIG. 4, the surface in the second direction of the N-type silicon wafer 1 after the boron-diffusion treatment is contacted with transfer rollers 14 included by the chain-type rinsing device.

Figure 5:
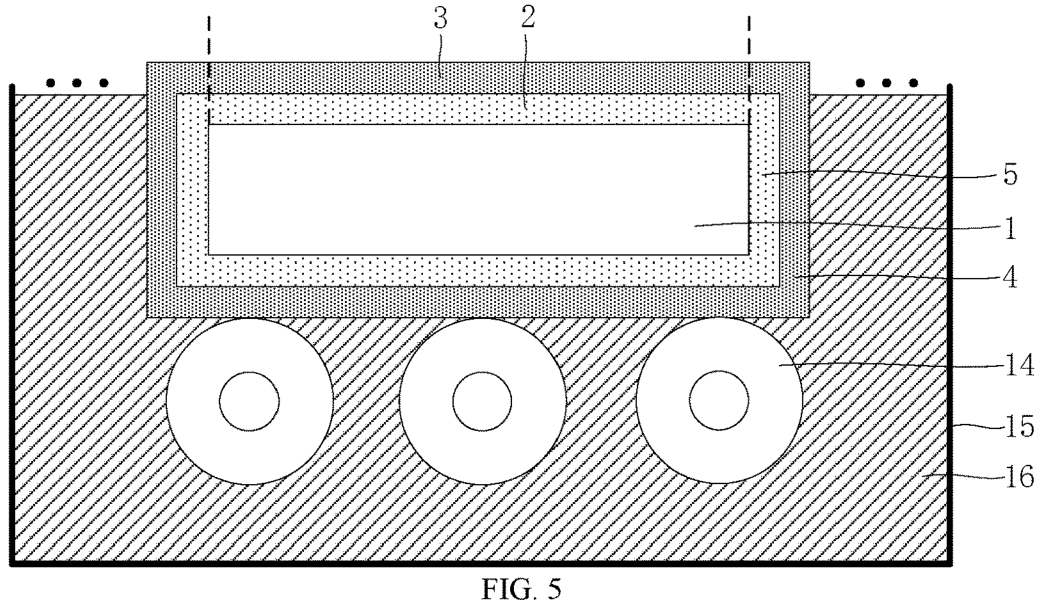
FIG. 5 is a schematic structural diagram of the conveying of the N-type silicon wafer after the boron-diffusion treatment to the pickling bath by using the transfer rollers according to an embodiment of the present disclosure.

As shown in FIG. 5, by using the transfer rollers 14, the N-type silicon wafer 1 after the boron-diffusion treatment is conveyed to a pickling bath 15 included by the chain-type rinsing device, wherein the liquid level of an acidic rinsing solution 16 located in the pickling bath 15 is higher than the surface in the second direction of the N-type silicon wafer 1, and lower than the surface in the first direction of the N-type silicon wafer 1. Moreover, by using the acidic rinsing solution 16, the winding-plated borosilicate-glass layer 4 is removed.

As an example, the acidic rinsing solution may be any acidic solution that can remove the winding-plated borosilicate-glass layer. For example, the acidic rinsing solution may be hydrofluoric acid. The concentration and the liquid-level height of the acidic rinsing solution and the process conditions for removing the winding-plated borosilicate-glass layer by using the acidic rinsing solution may be set according to practical demands, as long as they can be applied to the manufacturing method of the solar cell according to the embodiments of the present disclosure.

It can be understood that, as shown in FIG. 5, the surface in the second direction of the N-type silicon wafer 1 after the boron-diffusion treatment faces the transfer rollers 14. After the N-type silicon wafer 1 after the boron-diffusion treatment is conveyed to the pickling bath 15 by using the transfer rollers 14, the winding-plated borosilicate-glass layer 4 formed due to the winding plating can contact and react with the acidic rinsing solution 16 in the pickling bath 15, so as to remove the winding-plated borosilicate-glass layer 4 by using the acidic rinsing solution 16, and cause the winding-plated diffusion layer 5 to be exposed. Furthermore, the liquid level of the acidic rinsing solution 16 is lower than the surface in the first direction of the N-type silicon wafer 1, and therefore the diffusion layer 2 and the borosilicate-glass layer 3 located on the surface in the first direction of the N-type silicon wafer 1 cannot contact the acidic rinsing solution 16, whereby, after the treatment using the acidic rinsing solution 16, the diffusion layer 2 and the borosilicate-glass layer 3 can be maintained, to enable the borosilicate-glass layer 3 to serve as a mask for the subsequent treatments, to prevent the diffusion layer 2 and the surface in the first direction of the N-type silicon wafer 1 from being influenced by the subsequent treatments such as corrosion and rinsing, to increase the yield of the solar cell.

Figure 6:
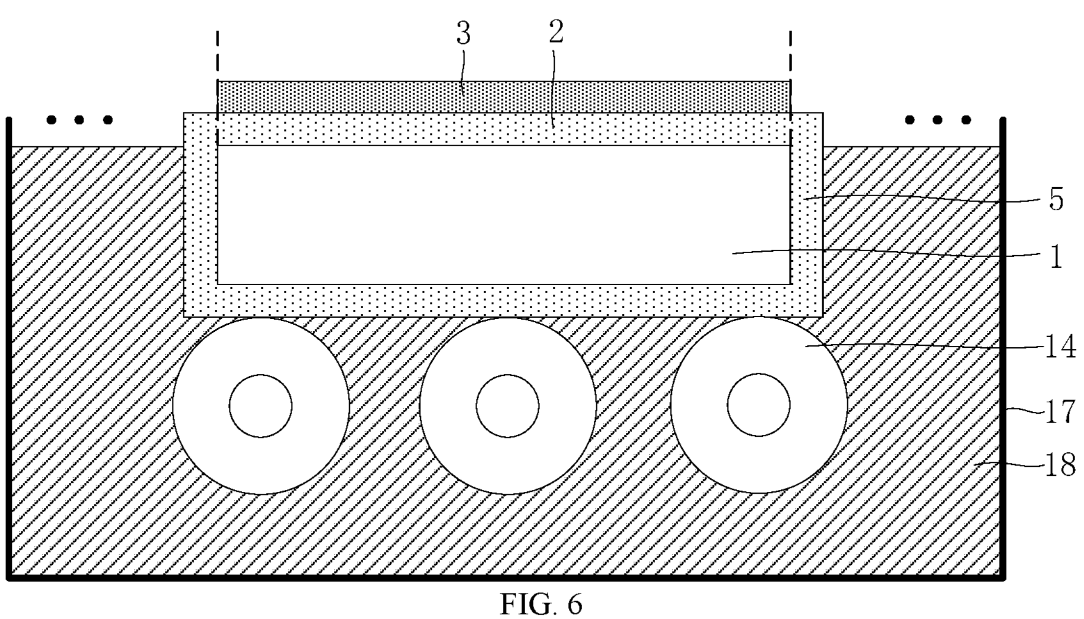
FIG. 6 is a schematic structural diagram of the conveying of the N-type silicon wafer that is treated by using the acidic rinsing solution to the alkaline-rinsing bath by using the transfer rollers according to an embodiment of the present disclosure.
Figure 7:
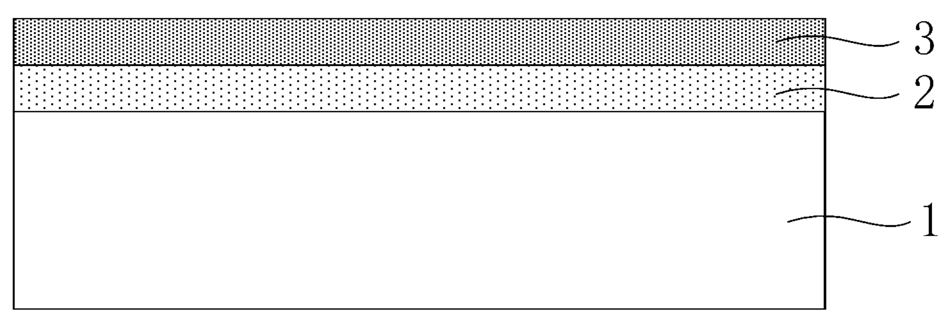
FIG. 7 is a schematic structural diagram after the first corroding and rinsing treatment to the N-type silicon wafer after the boron-diffusion treatment by using the chain-type rinsing device according to an embodiment of the present disclosure.

As shown in FIG. 6 and FIG. 7, by using the transfer rollers 14, the N-type silicon wafer 1 that is treated by using the acidic rinsing solution is conveyed to an alkaline-rinsing bath 17 included by the chain-type rinsing device, wherein the liquid level of an alkaline rinsing solution 18 located in the alkaline-rinsing bath 17 is higher than the surface in the second direction of the N-type silicon wafer 1, and lower than the surface in the first direction of the N-type silicon wafer 1. Furthermore, by using the alkaline rinsing solution 18, the winding-plated diffusion layer 5 is removed, and the polishing treatment is performed to the surface in the second direction of the N-type silicon wafer 1.

As an example, the alkaline rinsing solution may be any alkaline solution that can remove the winding-plated diffusion layer. For example, the alkaline rinsing solution may be an alkaline rinsing solution formed by deionized water, a potassium-hydroxide solution and a the polishing additive. The volume ratio of the deionized water, the potassium-hydroxide solution and the polishing additive may be 33.5:3.7:1. Certainly, the volume ratio of them may also be adjusted according to practical demands, and is not limited to that ratio. Moreover, the concentration of the potassium-hydroxide solution may be 44%-48% (for example, the concentration of the potassium-hydroxide solution may be 44%, 45%, 46%, 47%, 48% and so on). The polishing additive may be any polishing additive that can increase the transverse etching speed of the potassium-hydroxide solution and reduce the longitudinal etching speed of the potassium-hydroxide solution, to prevent sueding on the surface in the second direction of the N-type silicon wafer. For example, the polishing additive may be the alkaline polishing additive that is supplied by Changzhou Shichuang Energy Technology Co. Ltd, with the model of PS30 or PS31. Moreover, the treatment conditions for removing the winding-plated diffusion layer by using the alkaline rinsing solution may be set according to practical demands. For example, the treatment temperature may be 69° C.-70° C. The treatment duration may be 150 s-160 s. The treatment duration in the alkaline-rinsing bath may be adjusted by regulating the conveying speed of the transfer rollers.

It should be noted that the treatment temperature for removing the winding-plated diffusion layer by using the alkaline rinsing solution is generally high (for example, 69° C.-70° C.), and the solubility in the alkaline rinsing solution easily evaporates to the external environment or the cover plate included by the chain-type rinsing device, whereby the volume ratio of the components in the alkaline rinsing solution varies. Therefore, the corresponding solubility may be supplemented into the alkaline-rinsing bath, so that the volume ratio of the components in the alkaline rinsing solution satisfies the requirement of the operation. Particularly, how much solubility is supplemented into the alkaline-rinsing bath may be determined according to the size of the alkaline-rinsing bath and the treatment temperature. For example, if the volume of the alkaline-rinsing bath is 350 L and the treatment temperature is 70° C., the volume flow rate of the solubility supplemented into the alkaline-rinsing bath may be ⅙ L/min. Moreover, in the case in which the solar cell is produced in batch, the corresponding solubility and/or solvent may also be supplemented into the alkaline rinsing solution, so that the solubility and the corresponding liquid-level height of the alkaline rinsing solution satisfy the requirements of the operation, which can ensure the effect of reaction while increasing the manufacturing efficiency. For example, if the alkaline rinsing solution is an alkaline rinsing solution formed by deionized water, a potassium-hydroxide solution and a polishing additive, any one of the deionized water, the potassium-hydroxide solution and the polishing additive may be supplemented into the alkaline rinsing solution. The amounts of the supplemented solubility and solubility may be determined according to the factors such as the speed of the batch fabrication, and are not particularly limited herein.

It can be understood that, as shown in FIG. 6 and FIG. 7, after the N-type silicon wafer 1 that is treated by using the acidic rinsing solution is conveyed to the alkaline-rinsing bath 17 by using the transfer rollers 14, the exposed winding-plated diffusion layer 5 can contact and react with the alkaline rinsing solution 18 in the alkaline-rinsing bath 17, so as to remove the winding-plated diffusion layer 5 by using the alkaline rinsing solution 18, and enable the side surface and the surface in the second direction of the N-type silicon wafer 1 to be exposed. Subsequently, by using the alkaline rinsing solution 18, the polishing treatment can be performed to the surface in the second direction of the N-type silicon wafer 1 that is exposed.

In the following table, by taking the polishing treatment of different degrees using the alkaline rinsing solution and the polishing treatment using an acidic solution in the prior art as an example, the influences by the two modes on the reflectivity of the surface in the second direction of the N-type silicon wafer will be described.

| Item | Square block size | Reflectivity | WCT120 (J0) | Voltage | Current (A) |
|---|---|---|---|---|---|
| Example 1 | 15 μm | 45% | 3 fA/cm$^2$ | 700 mV | 9.9702 |
| Example 2 | 17 μm | 47% | 3 fA/cm$^2$ | 701 mV | 9.9681 |
| Example 3 | 17 μm | 47% | 3 fA/cm$^2$ | 700 mV | 9.9766 |
| Comparative Example 1 | No (acidic suede) | 31% | 9 fA/cm$^2$ | 697 mV | 9.9122 |
| Comparative Example 2 | No (acidic suede) | 32% | 8 fA/cm$^2$ | 697 mV | 9.9125 |

Examples 1-3 are the corresponding data after the polishing treatment to the surface in the second direction of the N-type silicon wafer using the alkaline rinsing solution according to the embodiments of the present disclosure. Comparative Examples 1-2 are the corresponding data after the polishing treatment to the surface in the second direction of the N-type silicon wafer using an acidic solution in the prior art. WCT120 refers to a minority-carrier-life testing device. If the values of the result data obtained in the WCT120 test are lower, that indicates that the surface in the second direction of the N-type silicon wafer is more even, and the effect of passivation is better. In this case, it can be seen from the data in the above table that, as compared with polishing treatment using an acidic solution, by the polishing treatment using the alkaline rinsing solution, the reflectivity to light rays by the surface in the second direction of the N-type silicon wafer can be increased from approximately 30% to above 45%, so that the surface in the second direction of the N-type silicon wafer can reflect more light rays into the N-type silicon wafer, which can further increase the utilization ratio of the light energy by the solar cell.

In an example, after the step of performing the polishing treatment to the surface in the second direction of the N-type silicon wafer, before the subsequent treatments, the manufacturing method of the solar cell may further include: in a first water-rinsing bath included by the chain-type rinsing device, spraying deionized water to the surface in the first direction and the surface in the second direction of the N-type silicon wafer after the polishing treatment, and performing a first rinsing treatment to the N-type silicon wafer after the polishing treatment. It can be understood that, after the polishing treatment to the surface in the second direction of the N-type silicon wafer, at least on the surface in the second direction of the N-type silicon wafer the corresponding rinsing solution remains. Based on that, before the step of, by using the passivation-contacting process, treating the surface in the second direction of the N-type silicon wafer, deionized water is sprayed to the surface in the first direction and the surface in the second direction of the N-type silicon wafer in the first water-rinsing bath, to rinse off the whole of the residual rinsing solution on the N-type silicon wafer, to prevent the rinsing solution from influencing the formation of the film layers such as the N-type silicon wafer and the tunneling oxidation layer, to increase the yield of the manufactured solar cell.

The rinsing temperature and the rinsing duration of the first rinsing treatment to the N-type silicon wafer after the polishing treatment using the deionized water in the first water-rinsing bath may be set according to practical demands. For example, the rinsing temperature may be 70° C. The rinsing duration may be 150 s-160 s. It should be understood that the rinsing temperature is close to the temperature for removing the winding-plated diffusion layer, and, therefore, by performing the first rinsing treatment to the N-type silicon wafer after the polishing treatment at that rinsing temperature, damaging on the N-type silicon wafer caused by a large temperature difference can be prevented, to increase the yield of the solar cell. Furthermore, such a rinsing duration cannot only ensure that the deionized water can completely rinse off the residual alkaline rinsing solution, but also can prevent the problem of a deteriorated manufacturing efficiency caused by an excessively long rinsing duration.

Figure 8:
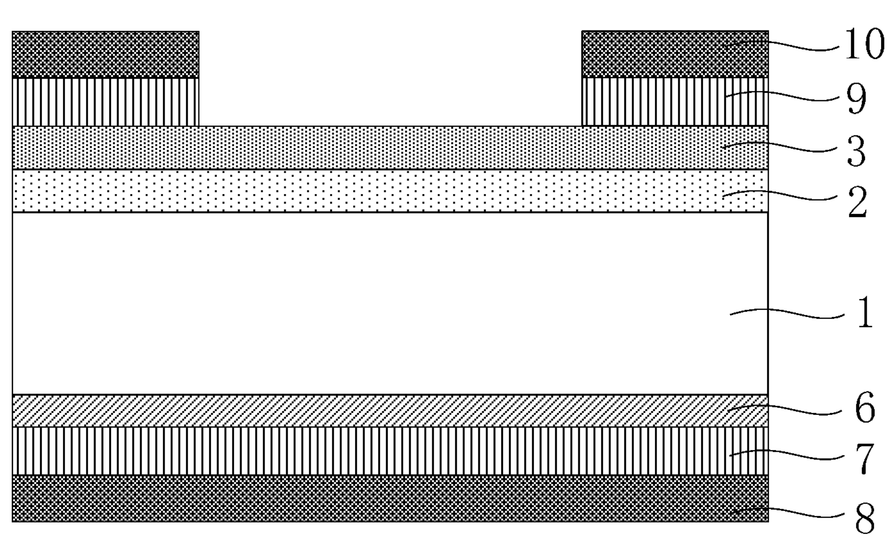
FIG. 8 is a first schematic structural diagram after the treatment to the surface in the second direction of the N-type silicon wafer by using the passivation-contacting process according to an embodiment of the present disclosure.

As shown in FIG. 8 and FIG. 9, by using the passivation-contacting process, the surface in the second direction of the N-type silicon wafer 1 is treated, to form a tunneling oxidation layer 6, a doped silicon layer 7 and a first phosphorosilicate-glass layer 8 that are sequentially stacked on the surface in the second direction of the N-type silicon wafer 1, and a winding-plated silicon layer 9 and a second phosphorosilicate-glass layer 10 are formed on at least part of the borosilicate-glass layer 3.

As an example, the tunneling oxidation layer and the silicon layer may be deposited sequentially on the surface in the second direction of the N-type silicon wafer after the polishing treatment by using the processes such as low-pressure chemical vapor deposition, plasma-enhanced chemical vapor deposition and atomic layer deposition. The materials and the thicknesses of the tunneling oxidation layer and the silicon layer may be set according to practical demands. For example, the tunneling oxidation layer may be a silicon-oxide layer. The silicon layer may be an amorphous-silicon layer or a polycrystalline-silicon layer. Moreover, while the silicon layer is deposited on the tunneling oxidation layer, the winding-plated silicon layer is formed on at least part of the borosilicate-glass layer due to winding plating, wherein the material of the winding-plated silicon layer is the same as the material of the silicon layer. For example, as shown in FIG. 8, the winding-plated silicon layer 9 may be formed merely within an edge area of the borosilicate-glass layer 3. As another example, as shown in FIG. 9, the winding-plated silicon layer 9 may cover the whole of the surface of the borosilicate-glass layer 3. Particularly, the area of the formation of the winding-plated silicon layer on the borosilicate-glass layer is relevant to the process parameters that are set in the deposition of the silicon layer. For example, when the silicon layer is deposited, if the silica-based gas introduced into the depositing chamber has a higher gas flowing speed, the area of the formation of the winding-plated silicon layer is larger. Subsequently, a phosphorous-diffusion treatment may be performed to the silicon layer by using processes such as thermal diffusion and ion implantation, so that the silicon layer forms the doped silicon layer. Correspondingly, the winding-plated silicon layer is also doped by a phosphorus impurity. Moreover, as shown in FIGS. 8 and 9, in the process of the phosphorous-diffusion treatment, the first phosphorosilicate-glass layer 8 is formed on the doped silicon layer 7, and the second phosphorosilicate-glass layer 10 is formed on the winding-plated silicon layer 9.

Figure 12:
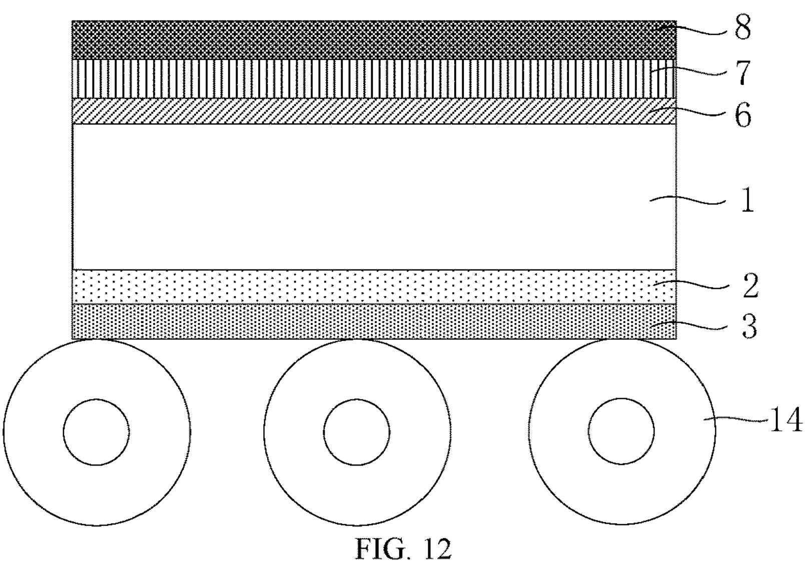
FIG. 12 is a schematic diagram of the position relation between the N-type silicon wafer after the second corroding and rinsing treatment and the transfer rollers according to an embodiment of the present disclosure.

As shown in FIG. 10 to FIG. 12, by using the chain-type rinsing device, a second corroding and rinsing treatment is performed to the surface in the first direction of the N-type silicon wafer 1 that is treated by using the passivation-contacting process, to sequentially remove the second phosphorosilicate-glass layer 10 and the winding-plated silicon layer 9.

The chain-type rinsing device may include a first rinsing tank and a second rinsing tank that are sequentially arranged, and transfer rollers for conveying. Particularly, the first rinsing tank is used to contain a first rinsing liquid for removing the second phosphorosilicate-glass layer. The second rinsing tank is used to contain the second rinsing solution for removing the winding-plated silicon layer. Moreover, the height relations of the transfer rollers provided over the first rinsing tank and the second rinsing tank with the liquid levels of the first rinsing solution and the second rinsing solution, respectively, may be determined according to the modes of rinsing used to remove the second phosphorosilicate-glass layer and the winding-plated silicon layer. As an example, as shown in FIG. 10, if the second phosphorosilicate-glass layer 10 is removed in the roller-carrying-liquid rinsing mode, the diameter of the transfer rollers 14 that are provided over the first rinsing tank 19 is H1, and the distance between the liquid level of the first rinsing solution 20 and the bottom of the transfer rollers 14 that are provided over the first rinsing tank 19 is H2, wherein the relation between them may be: ⅓ H1≤H2≤½ H1. As shown in FIG. 11, however, if the winding-plated silicon layer 9 is removed by being immerged in the rinsing liquid, the transfer rollers 14 that are provided over the second rinsing tank 21 may be submerged inside the second rinsing solution 22.

Moreover, the first rinsing solution may be any rinsing solution that can remove the second phosphorosilicate-glass layer. For example, the first rinsing solution may be a mixed solution of deionized water and hydrofluoric acid. The volume ratio of the deionized water to the hydrogen fluoride is 10:1-12:1 (for example, the volume ratio may be 10:1, 10.5:1, 11:1, 12:1 and so on).

Regarding the second rinsing solution, the second rinsing solution may be any rinsing solution that can remove the winding-plated silicon layer. For example, the second rinsing solution includes deionized water, a potassium-hydroxide solution and a polishing additive. The volume ratio of the deionized water, the potassium-hydroxide solution and the polishing additive is 30-40:3-4:1 (for example, the volume ratio may be 30:3:1, 35:3:1, 40:3:1, 30:4:1, 35:4:1, 40:4:1 and so on). The concentration of the potassium-hydroxide solution is 40%-50% (for example, the concentration may be 40%, 42%, 44%, 46%, 48%, 50% and so on). Moreover, the particular embodiments of the polishing additive may refer to the polishing additive contained in the alkaline rinsing solution described above, and are not discussed further herein.

As an example, the step of, by using the chain-type rinsing device, performing the second corroding and rinsing treatment to the surface in the first direction of the N-type silicon wafer that is treated by using the passivation-contacting process, to sequentially remove the second phosphorosilicate-glass layer and the winding-plated silicon layer may include the following steps:

As shown in FIG. 10, the surface in the first direction of the N-type silicon wafer 1 that is treated by using the passivation-contacting process is contacted with transfer rollers 14 included by the chain-type rinsing device.

As shown in FIG. 10, a water film (not shown in the figure) is spread fully on the surface in the second direction of the N-type silicon wafer 1 that is treated by using the passivation-contacting process, and, by using a first rinsing solution 20, by using a roller-carrying-liquid rinsing mode, the second phosphorosilicate-glass layer 10 is removed.

In practical applications, as shown in FIG. 10, the surface in the first direction of the N-type silicon wafer 1 that is treated by using the passivation-contacting process faces the transfer rollers 14. At this point, the second phosphorosilicate-glass layer 10 located on the outermost side of the surface in the first direction contacts the transfer rollers 14, and the N-type silicon wafer 1 that is treated by using the passivation-contacting process is conveyed to the first rinsing tank 19 by using the transfer rollers 14. In the first rinsing tank 19 containing the first rinsing solution 20, during the rotation of the transfer rollers 14, the first rinsing solution 20 contacting the transfer rollers 14 can be brought by the centripetal force to the second phosphorosilicate-glass layer 10, and react with the second phosphorosilicate-glass layer 10, to realize, by using the first rinsing solution 20, by using a roller-carrying-liquid rinsing mode, removing the second phosphorosilicate-glass layer 10. Particularly, the rinsing temperature for removing the second phosphorosilicate-glass layer 10 by using the first rinsing solution 20 may be set according to practical demands. For example, the rinsing temperature may be 10° C.-25° C.

It should be noted that, in the process of removing the second phosphorosilicate-glass layer, because the surface in the second direction of the N-type silicon wafer that is treated by using the passivation-contacting process faces upwardly, and is spread fully with a water film, at this point, even if the transfer rollers can bring the first rinsing solution to the surface in the second direction of the N-type silicon wafer, it does not react with the first phosphorosilicate-glass layer located on the outermost side of the surface in the second direction, whereby the first phosphorosilicate-glass layer can be maintained, and, accordingly, in the subsequent process of removing the winding-plated silicon layer, the first phosphorosilicate-glass layer can serve as the mask for protecting the doped silicon layer, to prevent the doped silicon layer from being influenced by the second rinsing solution in the subsequent process of removing the winding-plated silicon layer, to increase the yield of the manufactured solar cell.

As shown in FIG. 11, by using the transfer rollers 14, the N-type silicon wafer 1 that is treated by using the first rinsing solution is placed into a second rinsing solution 22, wherein the liquid level of the second rinsing solution 22 is higher than the surface in the first direction of the N-type silicon wafer 1. Furthermore, by using the second rinsing solution 22, the winding-plated silicon layer 9 is removed.

In practical applications, as shown in FIG. 11, after the second phosphorosilicate-glass layer is removed, the winding-plated silicon layer 9 that was originally joined to the second phosphorosilicate-glass layer is exposed, and contacts the transfer rollers 14. Based on that, the N-type silicon wafer 1 that is treated by using the first rinsing solution is conveyed to the second rinsing tank 21 by using the transfer rollers 14. Because the transfer rollers 14 that are provided over the second rinsing tank 21 are submerged inside the second rinsing solution 22, the N-type silicon wafer 1 located on the transfer rollers 14 can be placed in the second rinsing solution 22. Particularly, the liquid level of the second rinsing solution 22 may merely flush with the surface of the winding-plated silicon layer 9 that is closer to the borosilicate-glass layer 3, and may also be higher than the surface of the winding-plated silicon layer 9 that is closer to the borosilicate-glass layer 3, as long as the winding-plated silicon layer 9 can be removed by using the second rinsing solution 22. The rinsing conditions for removing the winding-plated silicon layer 9 by using the second rinsing solution 22 may be set according to practical demands. For example, the rinsing temperature may be 69° C.-70° C. The rinsing duration may be 135 s-150 s.

In an example, if the second rinsing solution includes the deionized water, the potassium-hydroxide solution and the polishing additive, and the rinsing temperature may be 69° C.-70° C., the step of, by using the chain-type rinsing device, removing the winding-plated silicon layer may further include: in a process of removing the winding-plated silicon layer by using the second rinsing solution, supplementing at least one of the deionized water, the potassium-hydroxide solution and the polishing additive into the second rinsing solution, to cause the volume ratio of the deionized water, the potassium-hydroxide solution and the polishing additive in the second rinsing solution to satisfy 30-40:3-4:1.

It can be understood that, because, when the winding-plated silicon layer is removed by using the second rinsing solution, the rinsing temperature is 69° C.-70° C., which is a high temperature, and the traditional chain-type rinsing devices are an open-type rinsing device or a rinsing device provided with a cover plate, at the high rinsing temperature, the deionized-water solution in the second rinsing solution evaporates into the environment or stays on the cover plate, which causes that the volume ratio of the deionized water, the potassium-hydroxide solution and the polishing additive in the second rinsing solution varies. However, by, during the rinsing, supplementing into the second rinsing solution the deionized water that is lost by evaporation, it can be ensured that, in the rinsing process, the volume ratio of the deionized water, the potassium-hydroxide solution and the polishing additive satisfies the requirement, which can ensure the effect of reaction, to increase the yield of the manufactured solar cell. Particularly, the addition amount of the deionized water supplemented into the second rinsing tank may be determined in the manner described above with respect to how to determine the addition amount of the solubility supplemented into the alkaline-rinsing bath, and is not discussed further herein. Moreover, in the practical applications, the solar cells are manufactured in bulk, to increase the manufacturing efficiency. Based on that, by, during the rinsing, supplementing into the second rinsing solution at least one of the deionized water, the potassium-hydroxide solution and the polishing additive, it can be ensured that, in the batch fabrication, the volume ratio of the deionized water, the potassium-hydroxide solution and the polishing additive in the second rinsing solution satisfies the requirement, which can ensure the effect of rinsing while increasing the manufacturing efficiency. Particularly, the addition amounts of the deionized water, the potassium-hydroxide solution and the polishing additive that are supplemented into the second rinsing tank may be determined according to the speed of the batch fabrication.

It should be noted that, if the second rinsing solution is other rinsing solutions that can remove the winding-plated silicon layer, the substances supplemented into the second rinsing tank may be determined according to the components included by the second rinsing solution.

As shown in FIG. 13 to FIG. 16, by using the same chain-type rinsing device, a third corroding and rinsing treatment is performed to the surface in the first direction and the surface in the second direction of the N-type silicon wafer 1 after the second corroding and rinsing treatment, to remove the borosilicate-glass layer 3 and the first phosphorosilicate-glass layer 8.

Figure 13:
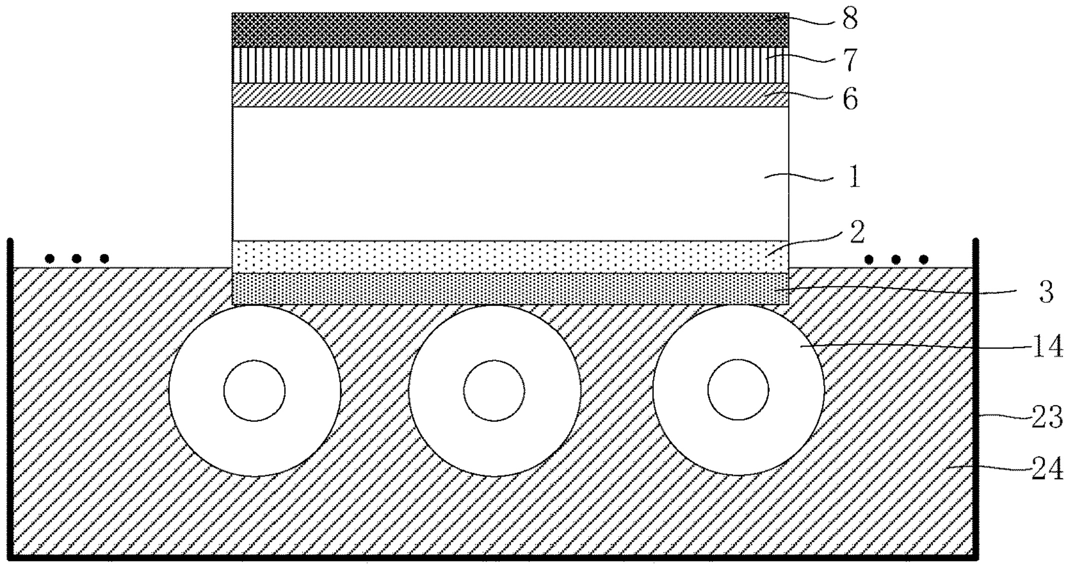
FIG. 13 is a schematic structural diagram of the conveying of the N-type silicon wafer after the second corroding and rinsing treatment to the third rinsing tank by using the transfer rollers according to an embodiment of the present disclosure.
Figure 15:
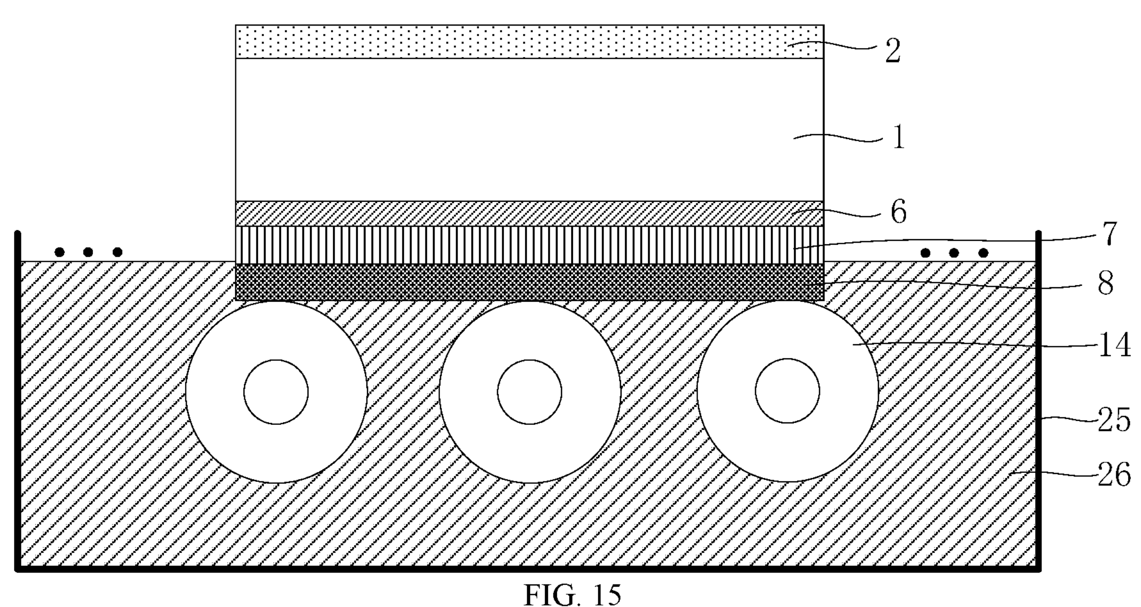
FIG. 15 is a schematic structural diagram of the conveying of the N-type silicon wafer that is treated by using the third rinsing solution to the fourth rinsing tank by using the transfer rollers according to an embodiment of the present disclosure.
Figure 16:
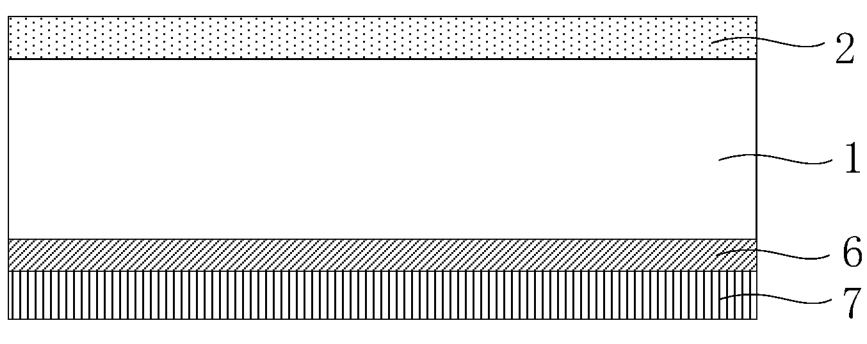
FIG. 16 is a schematic structural diagram after the third corroding and rinsing treatment to the N-type silicon wafer after the second corroding and rinsing treatment by using the same chain-type rinsing device according to an embodiment of the present disclosure.

The chain-type rinsing device performing the third corroding and rinsing treatment and the chain-type rinsing device performing the second corroding and rinsing treatment described above are the same chain-type rinsing device. The chain-type rinsing device further includes a third rinsing tank and a fourth rinsing tank. The first rinsing tank, the second rinsing tank, the third rinsing tank and the fourth rinsing tank included by the chain-type rinsing device are sequentially arranged. Particularly, the types of the rinsing solutions contained in the third rinsing tank and the fourth rinsing tank, and the position relations between the transfer rollers provided over them and the liquid levels of the corresponding rinsing solutions, may be set according to the sequence and the modes of the removal of the borosilicate-glass layer and the first phosphorosilicate-glass layer. For example, as shown in FIG. 13 and FIG. 15, if the borosilicate-glass layer 3 is removed in the third rinsing tank 23, the first phosphorosilicate-glass layer 8 is removed in the fourth rinsing tank 25, and the borosilicate-glass layer 3 and the first phosphorosilicate-glass layer 8 are removed by being immerged in the rinsing liquids, the third rinsing tank 23 is used to contain the third rinsing solution 24 for removing the borosilicate-glass layer 3, and the transfer rollers 14 that are provided over the third rinsing tank 23 are submerged inside the third rinsing solution 24. The fourth rinsing tank 25 is used to contain the fourth rinsing solution 26 for removing the first phosphorosilicate-glass layer 8, and the transfer rollers 14 that are provided over the fourth rinsing tank 25 are submerged inside the fourth rinsing solution 26. As another example, if the first phosphorosilicate-glass layer is removed in the third rinsing tank, the borosilicate-glass layer is removed in the fourth rinsing tank, and the first phosphorosilicate-glass layer and the borosilicate-glass layer are removed by being immerged in the rinsing liquids, the third rinsing tank is used to contain the fourth rinsing solution for removing the first phosphorosilicate-glass layer, and the transfer rollers that are provided over the third rinsing tank are submerged inside the fourth rinsing solution. The fourth rinsing tank is used to contain the third rinsing solution for removing the borosilicate-glass layer, and the transfer rollers that are provided over the fourth rinsing tank are submerged inside the third rinsing solution.

Moreover, the third rinsing solution may be any rinsing solution that can remove the borosilicate-glass layer. For example, the third rinsing solution may be a mixed solution of deionized water, hydrogen fluoride, hydrogen peroxide and hydrogen chloride. The volume ratio of the deionized water, the hydrogen fluoride, the hydrogen peroxide and the hydrogen chloride may be 9-10:4-4.5:1-1.2:1.2 (for example, the volume ratio may be 9:4:1:1.2, 9.5:4:1:1.2, 10:4.5:1.2:1.2 and so on).

Regarding the fourth rinsing solution, the fourth rinsing solution may be any rinsing solution that can remove the first phosphorosilicate-glass layer. For example, the fourth rinsing solution may be a mixed solution of deionized water and hydrogen fluoride. The volume ratio of the deionized water to the hydrogen fluoride is 5.5-6:1 (for example, the volume ratio may be 5.5:1, 5.7:1, 6:1 and so on).

As an example, as shown in FIG. 13, the step of, by using the same chain-type rinsing device, removing the borosilicate-glass layer 3 may include: placing the surface in the first direction of the N-type silicon wafer 1 after the second corroding and rinsing treatment into a third rinsing solution 24, wherein the liquid level of the third rinsing solution 24 is higher than the surface in the first direction of the N-type silicon wafer 1, and, by using the third rinsing solution 24, removing the borosilicate-glass layer 3.

In practical applications, as shown in FIG. 12 and FIG. 13, if the third rinsing tank 23 is used to contain the third rinsing solution 24 for removing the borosilicate-glass layer 3, after the second corroding and rinsing treatment, the borosilicate-glass layer 3 joined to the winding-plated silicon layer is exposed, and contacts the transfer rollers 14. Based on that, the N-type silicon wafer 1 after the second corroding and rinsing treatment may be directly conveyed to the third rinsing tank 23 by using the transfer rollers 14. Because the transfer rollers 14 that are provided over the third rinsing tank 23 are submerged inside the third rinsing solution 24, the N-type silicon wafer 1 located on the transfer rollers 14 can be placed in the third rinsing solution 24. Particularly, the liquid level of the third rinsing solution 24 may merely flush with the surface of the borosilicate-glass layer 3 that is closer to the diffusion layer 2, and may also be higher than the surface of the borosilicate-glass layer 3 that is closer to the diffusion layer 2, as long as the borosilicate-glass layer 3 can be removed by using the third rinsing solution 24.

Moreover, if the fourth rinsing tank is used to contain the third rinsing solution for removing the borosilicate-glass layer, after the treatment using the fourth rinsing solution in the third rinsing tank, the doped silicon layer joined to the first phosphorosilicate-glass layer is exposed, and contacts the transfer rollers. Based on that, before the N-type silicon wafer that is treated by using the fourth rinsing solution is conveyed to the fourth rinsing tank by using the transfer rollers, it is required to be inversely placed, so that the borosilicate-glass layer contacts the transfer rollers. Particularly, how to remove the borosilicate-glass layer by using the third rinsing solution in the fourth rinsing tank, and the liquid-level height of the third rinsing solution, may refer to the preceding context, and are not discussed further herein.

As an example, as shown in FIG. 15, the step of, by using the same chain-type rinsing device, removing the first phosphorosilicate-glass layer 8 may include: placing the surface in the second direction of the N-type silicon wafer 1 after the second corroding and rinsing treatment into a fourth rinsing solution 26, wherein the liquid level of the fourth rinsing solution 26 is higher than the surface in the second direction of the N-type silicon wafer 1, and, by using the fourth rinsing solution 26, removing the first phosphorosilicate-glass layer 8.

Figure 14:
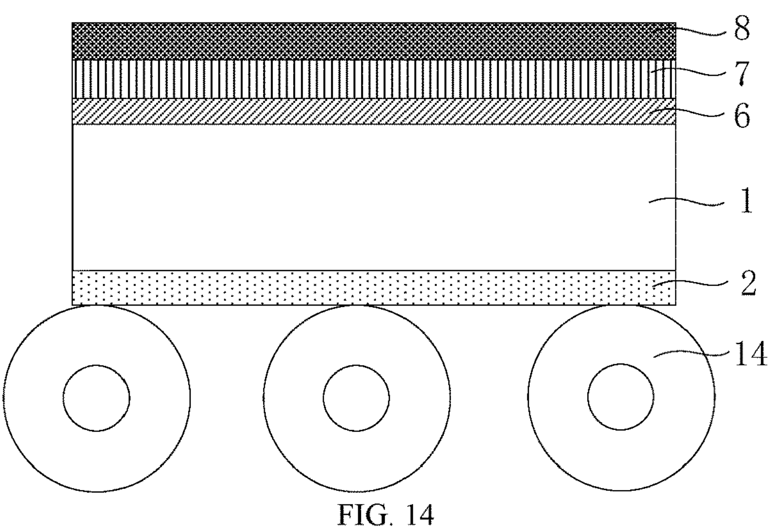
FIG. 14 is a schematic diagram of the position relation between the N-type silicon wafer that is treated by using the third rinsing solution and the transfer rollers according to an embodiment of the present disclosure.

In practical applications, as shown in FIG. 14 and FIG. 15, if the fourth rinsing tank 25 is used to contain the fourth rinsing solution 26 for removing the first phosphorosilicate-glass layer 8, after the treatment using the third rinsing solution in the third rinsing tank 23, the diffusion layer 2 joined to the borosilicate-glass layer is exposed, and contacts the transfer rollers 14. Based on that, before the N-type silicon wafer 1 that is treated by using the third rinsing solution is conveyed to the fourth rinsing tank 25 by using the transfer rollers 14, it is required to be inversely placed, so that the first phosphorosilicate-glass layer 8 contacts the transfer rollers 14. Particularly, the liquid level of the fourth rinsing solution 26 may merely flush with the surface of the first phosphorosilicate-glass layer 8 that is closer to the doped silicon layer 7, and may also be higher than the surface of the first phosphorosilicate-glass layer 8 that is closer to the doped silicon layer 7, as long as the first phosphorosilicate-glass layer 8 can be removed by using the fourth rinsing solution 26.

Moreover, if the third rinsing tank is used to contain the fourth rinsing solution for removing the first phosphorosilicate-glass layer, after the second corroding and rinsing treatment, the borosilicate-glass layer joined to the winding-plated silicon layer is exposed, and contacts the transfer rollers. Based on that, before the N-type silicon wafer after the second corroding and rinsing treatment is conveyed to the third rinsing tank by using the transfer rollers, it is required to be inversely placed, so that the first phosphorosilicate-glass layer contacts the transfer rollers. Particularly, how to remove the first phosphorosilicate-glass layer by using the fourth rinsing solution in the third rinsing tank, and the liquid-level height of the fourth rinsing solution, may refer to the preceding context, and are not discussed further herein.

It should be noted that, as shown in FIG. 12 to FIG. 15, because, after the winding-plated silicon layer whose one face located in the first direction is removed, the borosilicate-glass layer 3 joined to the winding-plated silicon layer is exposed, and contacts the transfer rollers 14, based on that, as compared with the two inverse-placing operations that the N-type silicon wafer 1 is required to undergo when the first phosphorosilicate-glass layer 8 is firstly removed and the winding-plated silicon layer is subsequently removed, after the winding-plated silicon layer is removed, the surface in the first direction of the N-type silicon wafer 1 that is treated by using the second rinsing solution is directly placed into the third rinsing solution 24 by the transfer rollers 14 to firstly remove the borosilicate-glass layer 3. In this case, it is merely required that, after the borosilicate-glass layer 3 is removed, one time of the inverse-placing operation is performed to the N-type silicon wafer 1, and the removal of the borosilicate-glass layer 3 and the first phosphorosilicate-glass layer 8 can be completed, which can reduce the time quantity of the inverse placing of the N-type silicon wafer 1, and reduce the risk in damaging the N-type silicon wafer 1 by the device performing the inverse-placing operation, to increase the manufacturing efficiency of the solar cell while increasing its fabrication yield.

In an example, the chain-type rinsing device may further include a second water-rinsing bath for performing the second rinsing treatment. The second water-rinsing bath is provided between the second rinsing tank and the third rinsing tank.

After the step of, by using the chain-type rinsing device, removing the winding-plated silicon layer, before the step of, by using the same chain-type rinsing device, removing the borosilicate-glass layer, the manufacturing method of the solar cell may further include: in the second water-rinsing bath, spraying deionized water to the surface in the first direction and the surface in the second direction of the N-type silicon wafer after the second corroding and rinsing treatment, to perform the second rinsing treatment to the N-type silicon wafer after the second corroding and rinsing treatment.

It can be understood that, after the winding-plated silicon layer is removed by using the second rinsing solution in the second rinsing tank, on the surface of the N-type silicon wafer that is treated by using the second rinsing solution the second rinsing solution remains. Based on that, before the borosilicate-glass layer or the first phosphorosilicate-glass layer is removed by using the corresponding rinsing solutions in the third rinsing tank, the second rinsing treatment is performed to the N-type silicon wafer that is treated by using the second rinsing solution by using the second water-rinsing bath provided between the second rinsing tank and the third rinsing tank, to remove the whole of the residual second rinsing solution by using the deionized water, which can prevent the second rinsing solution from affecting the effect of rinsing of the corresponding rinsing solutions, to increase the yield of the solar cell.

The rinsing temperature and the rinsing duration of the second rinsing treatment to the N-type silicon wafer that is treated by using the second rinsing solution using the deionized water in the second water-rinsing bath may be set according to practical demands. For example, the rinsing temperature may be 70° C. The rinsing duration may be 135 s-150 s. It should be understood that the rinsing temperature is close to the temperature for removing the winding-plated silicon layer, and, therefore, by performing the second rinsing treatment to the N-type silicon wafer that is treated by using the second rinsing solution at that rinsing temperature, damaging on the N-type silicon wafer caused by a large temperature difference can be prevented, to increase the yield of the solar cell. Furthermore, such a rinsing duration cannot only ensure that the deionized water can completely rinse off the residual second rinsing solution, but also can prevent the problem of a deteriorated manufacturing efficiency caused by an excessively long rinsing duration.

It can be known from the above contents that both of the first corroding and rinsing treatment and the polishing treatment are performed in the same chain-type rinsing device. Furthermore, subsequently, after the treatment using the passivation-contacting process, the removal of the second phosphorosilicate-glass layer, the winding-plated silicon layer, the borosilicate-glass layer and the first phosphorosilicate-glass layer that are formed by winding plating or diffusion is also performed in the same chain-type rinsing device. In other words, it is not required to transfer the N-type silicon wafer that is correspondingly treated between different rinsing devices, which can reduce the time wasted on transferring, and can reduce the rinsing duration of approximately 90 minutes that is required to be spent on removing the second phosphorosilicate-glass layer, the winding-plated silicon layer, the borosilicate-glass layer and the first phosphorosilicate-glass layer in the prior art to 15 to 20 minutes, thereby highly increasing the manufacturing efficiency of the solar cell. In another aspect, that can prevent damage on the N-type silicon wafer caused by transferring devices provided between the different rinsing devices by factors such as bumping or friction, and prevent that, during the transferring, the N-type silicon wafer stays in the external environment for a long time and thus reacts with the air to cause the N-type silicon wafer to be polluted, which finally can cause that the yield of the manufactured solar cell can be increased from approximately 59.1% to above 98%.

Figure 17:
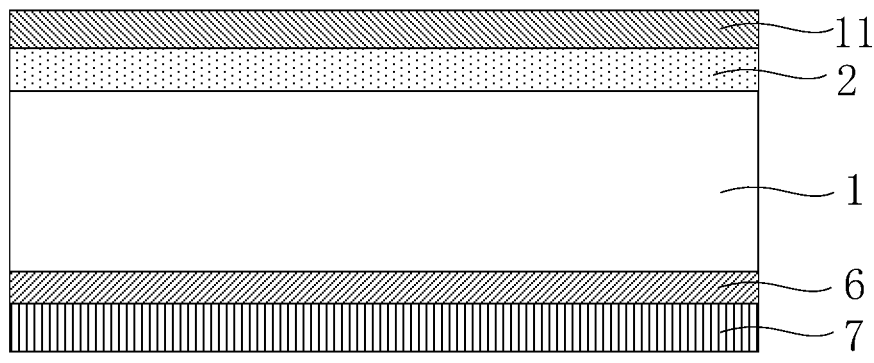
FIG. 17 is a schematic structural diagram after the formation of the first passivation layer on the diffusion layer according to an embodiment of the present disclosure.

In an example, after the step of, by using the same chain-type rinsing device, performing the third corroding and rinsing treatment to the surface in the first direction and the surface in the second direction of the N-type silicon wafer after the second corroding and rinsing treatment, to remove the borosilicate-glass layer and the first phosphorosilicate-glass layer, the manufacturing method of the solar cell may further include:

As shown in FIG. 17, a first passivation layer 2 is formed on the diffusion layer 11.

As an example, the first passivation layer may be formed by using the processes such as chemical vapor deposition and atomic layer deposition. The material and the thickness of the first passivation layer may be set according to practical demands. For example, the material of the first passivation layer may be aluminium oxide. In this case, because the type of the doping of the diffusion layer is the P+ type, and the negative fixed charges carried by the aluminium oxide have an effect of shielding the electron carriers (minority carriers) on the silicon surface, the concentration of the electron carriers on the surface can be reduced, which can reduce the surface recombination rate, so as to enable the electrodes located on the surface in the first direction of the N-type silicon wafer to collect more hole carriers, to increase the photoelectric conversion efficiency of the solar cell.

Figure 18:
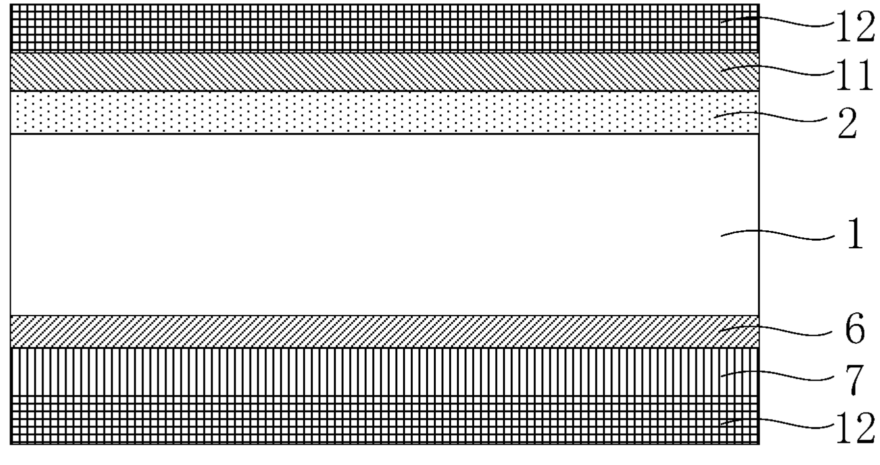
FIG. 18 is a schematic structural diagram after the formation of the second passivation layers on both of the first passivation layer and the doped silicon layer according to an embodiment of the present disclosure.

As shown in FIG. 18, a passivation treatment is performed to the first passivation layer 11 and the doped silicon layer 7, to form second passivation layers 12 on both of the first passivation layer 11 and the doped silicon layer 7. The material of the second passivation layers 12 and the material of the first passivation layer 11 are different.

As an example, the second passivation layers may be formed on the first passivation layer and the doped silicon layer by using the processes such as chemical vapor deposition and atomic layer deposition. The material and the thickness of the second passivation layers may be set according to practical demands. For example, the material of the second passivation layers may be silicon nitride. In this case, because the silicon-nitride layer has the effect of antireflection, the second passivation layers formed on the first passivation layer and the doped silicon layer can increase the absorption of light rays by the solar cell, to increase the utilization ratio of the light energy by the solar cell.

As shown in FIG. 19, a metallization treatment is performed to each of the second passivation layers 12, to form electrodes 13 on the second passivation layers 12.

As an example, the electrodes may be formed by using the processes such as printing and sintering. The particular positions on the second passivation layers of the electrodes, and the material of the electrodes, may be set according to practical demands. For example, the material of the electrodes may be a metal material such as silver, copper and nickel.

An embodiment of the present disclosure further provides a solar cell, wherein the solar cell is manufactured by using the manufacturing method of the solar cell according to the above embodiments.

As compared with the prior art, the advantageous effects of the solar cell according to the embodiments of the present disclosure may refer to the description on the advantageous effects of the manufacturing method of the solar cell according to the above embodiments, and are not discussed further herein.

In the above description, the technical details such as the patterning and the etching of the layers are not described in detail. However, a person skilled in the art should understand that the layers, the regions and so on of the required shapes may be formed by using various technical means. In addition, in order to form the same structure, a person skilled in the art may also design methods that are not completely the same as the methods described above. In addition, although the embodiments are described individually above, that does not mean that the features in the embodiments cannot be advantageously combined for usage.

The embodiments of the present disclosure are described above. However, those embodiments are merely for the purpose of description, and are not intended to limit the scope of the present disclosure. The scope of the present disclosure is defined by the appended claims and equivalents thereof. A person skilled in the art may make various substitutions and modifications without departing from the scope of the present disclosure, and all of those substitutions and modifications should fall within the scope of the present disclosure.

The invention claimed is:

1. A manufacturing method of a solar cell, wherein the manufacturing method comprises:

performing a boron-diffusion treatment to one surface in a first direction of an N-type silicon wafer, forming a diffusion layer and a borosilicate-glass layer that are sequentially stacked on the surface in the first direction of the N-type silicon wafer, and forming a winding-plated diffusion layer and a winding-plated borosilicate-glass layer on a side surface and one surface in a second direction of the N-type silicon wafer;

by using a chain-type rinsing device, performing a first corroding and rinsing treatment to the side surface and the surface in the second direction of the N-type silicon wafer after the boron-diffusion treatment, to sequentially remove the winding-plated borosilicate-glass layer and the winding-plated diffusion layer, and performing a polishing treatment to the surface in the second direction of the N-type silicon wafer;

by using a passivation-contacting process, treating the surface in the second direction of the N-type silicon wafer, to form a tunneling oxidation layer, a doped silicon layer and a first phosphorosilicate-glass layer that are sequentially stacked on the surface in the second direction of the N-type silicon wafer, and forming a winding-plated silicon layer and a second phosphorosilicate-glass layer on at least part of the borosilicate-glass layer;

by using the chain-type rinsing device, performing a second corroding and rinsing treatment to the surface in the first direction of the N-type silicon wafer that is treated by using the passivation-contacting process, to sequentially remove the second phosphorosilicate-glass layer and the winding-plated silicon layer; and by using the same chain-type rinsing device, performing a third corroding and rinsing treatment to the surface in the first direction and the surface in the second direction of the N-type silicon wafer after the second corroding and rinsing treatment, to remove the borosilicate-glass layer and the first phosphorosilicate-glass layer.

2. The manufacturing method of the solar cell according to claim 1, wherein the step of, by using the chain-type rinsing device, performing the first corroding and rinsing treatment to the side surface and the surface in the second direction of the N-type silicon wafer after the boron-diffusion treatment, to sequentially remove the winding-plated borosilicate-glass layer and the winding-plated diffusion layer, and performing the polishing treatment to the surface in the second direction of the N-type silicon wafer comprises:

contacting the surface in the second direction of the N-type silicon wafer after the boron-diffusion treatment with transfer rollers comprised by the chain-type rinsing device;

conveying the N-type silicon wafer after the boron-diffusion treatment to a pickling bath comprised by the chain-type rinsing device by using the transfer rollers, wherein a liquid level of an acidic rinsing solution located in the pickling bath is higher than the surface in the second direction of the N-type silicon wafer, and lower than the surface in the first direction of the N-type silicon wafer, and removing the winding-plated borosilicate-glass layer by using the acidic rinsing solution; and by using the transfer rollers, conveying the N-type silicon wafer that is treated by using the acidic rinsing solution to an alkaline-rinsing bath comprised by the chain-type rinsing device, wherein a liquid level of an alkaline rinsing solution located in the alkaline-rinsing bath is higher than the surface in the second direction of the N-type silicon wafer, and lower than the surface in the first direction of the N-type silicon wafer, and, by using the alkaline rinsing solution, removing the winding-plated diffusion layer, and performing the polishing treatment to the surface in the second direction of the N-type silicon wafer.

3. The manufacturing method of the solar cell according to claim 1, wherein after the step of performing the polishing treatment to the surface in the second direction of the N-type silicon wafer, and before the step of, by using the passivation-contacting process, treating the surface in the second direction of the N-type silicon wafer, the manufacturing method of the solar cell further comprises:

in a first water-rinsing bath comprised by the chain-type rinsing device, spraying deionized water to the surface in the first direction and the surface in the second direction of the N-type silicon wafer after the polishing treatment, and performing a first rinsing treatment to the N-type silicon wafer after the polishing treatment.

4. The manufacturing method of the solar cell according to claim 1, wherein the step of, by using the chain-type rinsing device, performing the second corroding and rinsing treatment to the surface in the first direction of the N-type silicon wafer that is treated by using the passivation-contacting process, to sequentially remove the second phosphorosilicate-glass layer and the winding-plated silicon layer comprises:

contacting the surface in the first direction of the N-type silicon wafer that is treated by using the passivation-contacting process with transfer rollers comprised by the chain-type rinsing device;

spreading a water film fully on the surface in the second direction of the N-type silicon wafer that is treated by using the passivation-contacting process, and, by using a first rinsing solution, removing the second phosphorosilicate-glass layer by using a roller-carrying-liquid rinsing mode; and by using the transfer rollers, placing the N-type silicon wafer that is treated by using the first rinsing solution into a second rinsing solution, wherein a liquid level of the second rinsing solution is higher than the surface in the first direction of the N-type silicon wafer, and removing the winding-plated silicon layer by using the second rinsing solution.

5. The manufacturing method of the solar cell according to claim 4, wherein the second rinsing solution comprises deionized water, a potassium-hydroxide solution and a polishing additive;

a volume ratio of the deionized water, the potassium-hydroxide solution and the polishing additive is 30-40:3-4:1;

a concentration of the potassium-hydroxide solution is 40%-50%;

a rinsing temperature is 69° C.-70° C.; and a rinsing duration is 135 s-150 s.

6. The manufacturing method of the solar cell according to claim 5, wherein the step of, by using the chain-type rinsing device, removing the winding-plated silicon layer further comprises:

in a process of removing the winding-plated silicon layer by using the second rinsing solution, supplementing at least one of the deionized water, the potassium-hydroxide solution and the polishing additive into the second rinsing solution, to cause the volume ratio of the deionized water, the potassium-hydroxide solution and the polishing additive in the second rinsing solution to satisfy 30-40:3-4:1.

7. The manufacturing method of the solar cell according to claim 1, wherein the step of, by using the same chain-type rinsing device, removing the borosilicate-glass layer comprises:

placing the surface in the first direction of the N-type silicon wafer after the second corroding and rinsing treatment into a third rinsing solution, wherein a liquid level of the third rinsing solution is higher than the surface in the first direction of the N-type silicon wafer, and removing the borosilicate-glass layer by using the third rinsing solution.

8. The manufacturing method of the solar cell according to claim 1, wherein the step of, by using the same chain-type rinsing device, removing the first phosphorosilicate-glass layer comprises:

placing the surface in the second direction of the N-type silicon wafer after the second corroding and rinsing treatment into a fourth rinsing solution, wherein a liquid level of the fourth rinsing solution is higher than the surface in the second direction of the N-type silicon wafer, and removing the first phosphorosilicate-glass layer by using the fourth rinsing solution.

9. The manufacturing method of the solar cell according to claim 1, wherein the chain-type rinsing device comprises a first rinsing tank, a second rinsing tank, a third rinsing tank and a fourth rinsing tank that are sequentially arranged, and a plurality of transfer rollers for conveying;

the first rinsing tank is used to contain a first rinsing liquid for removing the second phosphorosilicate-glass layer, a diameter of the transfer rollers that are provided over the first rinsing tank is H1, and a distance between a liquid level of the first rinsing solution and a bottom of the transfer rollers that are provided over the first rinsing tank is H2, wherein $\frac{1}{3}$ H1≤H2≤$\frac{1}{2}$ H1;

the second rinsing tank is used to contain the second rinsing solution for removing the winding-plated silicon layer, and the transfer rollers that are provided over the second rinsing tank are submerged inside the second rinsing solution; and the third rinsing tank is used to contain the third rinsing solution for removing the borosilicate-glass layer, the transfer rollers that are provided over the third rinsing tank are submerged inside the third rinsing solution, the fourth rinsing tank is used to contain the fourth rinsing solution for removing the first phosphorosilicate-glass layer, and the transfer rollers that are provided over the fourth rinsing tank are submerged inside the fourth rinsing solution; or the third rinsing tank is used to contain the fourth rinsing solution for removing the first phosphorosilicate-glass layer, the transfer rollers that are provided over the third rinsing tank are submerged inside the fourth rinsing solution, the fourth rinsing tank is used to contain the third rinsing solution for removing the borosilicate-glass layer, and the transfer rollers that are provided over the fourth rinsing tank are submerged inside the third rinsing solution.

10. The manufacturing method of the solar cell according to claim 9, wherein the chain-type rinsing device further comprises a second water-rinsing bath for performing a second rinsing treatment;

the second water-rinsing bath is provided between the second rinsing tank and the third rinsing tank; and after the step of, by using the chain-type rinsing device, removing the winding-plated silicon layer, and before the step of, by using the same chain-type rinsing device, removing the borosilicate-glass layer, the manufacturing method of the solar cell further comprises:

in the second water-rinsing bath, spraying deionized water to the surface in the first direction and the surface in the second direction of the N-type silicon wafer after the second corroding and rinsing treatment, to perform the second rinsing treatment to the N-type silicon wafer after the second corroding and rinsing treatment.

11. The manufacturing method of the solar cell according to claim 10, wherein after the step of, by using the same chain-type rinsing device, performing the third corroding and rinsing treatment to the surface in the first direction and the surface in the second direction of the N-type silicon wafer after the second corroding and rinsing treatment, to remove the borosilicate-glass layer and the first phosphoro-silicate-glass layer, the manufacturing method of the solar cell further comprises:
forming a first passivation layer on the diffusion layer;
performing a passivation treatment to the first passivation layer and the doped silicon layer, to form second passivation layers on both of the first passivation layer and the doped silicon layer, wherein a material of the second passivation layers and a material of the first passivation layer are different; and
performing a metallization treatment to each of the second passivation layers, to form electrodes on the second passivation layers.

12. A solar cell, wherein the solar cell is manufactured by using the manufacturing method of the solar cell according to claim 1.

13. The manufacturing method of the solar cell according to claim 2, wherein after the step of, by using the same chain-type rinsing device, performing the third corroding and rinsing treatment to the surface in the first direction and the surface in the second direction of the N-type silicon wafer after the second corroding and rinsing treatment, to remove the borosilicate-glass layer and the first phosphoro-silicate-glass layer, the manufacturing method of the solar cell further comprises:
forming a first passivation layer on the diffusion layer;
performing a passivation treatment to the first passivation layer and the doped silicon layer, to form second passivation layers on both of the first passivation layer and the doped silicon layer, wherein a material of the second passivation layers and a material of the first passivation layer are different; and
performing a metallization treatment to each of the second passivation layers, to form electrodes on the second passivation layers.

14. The manufacturing method of the solar cell according to claim 3, wherein after the step of, by using the same chain-type rinsing device, performing the third corroding and rinsing treatment to the surface in the first direction and the surface in the second direction of the N-type silicon wafer after the second corroding and rinsing treatment, to remove the borosilicate-glass layer and the first phosphoro-silicate-glass layer, the manufacturing method of the solar cell further comprises:
forming a first passivation layer on the diffusion layer;
performing a passivation treatment to the first passivation layer and the doped silicon layer, to form second passivation layers on both of the first passivation layer and the doped silicon layer, wherein a material of the second passivation layers and a material of the first passivation layer are different; and
performing a metallization treatment to each of the second passivation layers, to form electrodes on the second passivation layers.

15. The manufacturing method of the solar cell according to claim 4, wherein after the step of, by using the same chain-type rinsing device, performing the third corroding and rinsing treatment to the surface in the first direction and the surface in the second direction of the N-type silicon wafer after the second corroding and rinsing treatment, to remove the borosilicate-glass layer and the first phosphoro-silicate-glass layer, the manufacturing method of the solar cell further comprises:
forming a first passivation layer on the diffusion layer;
performing a passivation treatment to the first passivation layer and the doped silicon layer, to form second passivation layers on both of the first passivation layer and the doped silicon layer, wherein a material of the second passivation layers and a material of the first passivation layer are different; and
performing a metallization treatment to each of the second passivation layers, to form electrodes on the second passivation layers.

16. The manufacturing method of the solar cell according to claim 5, wherein after the step of, by using the same chain-type rinsing device, performing the third corroding and rinsing treatment to the surface in the first direction and the surface in the second direction of the N-type silicon wafer after the second corroding and rinsing treatment, to remove the borosilicate-glass layer and the first phosphoro-silicate-glass layer, the manufacturing method of the solar cell further comprises:
forming a first passivation layer on the diffusion layer;
performing a passivation treatment to the first passivation layer and the doped silicon layer, to form second passivation layers on both of the first passivation layer and the doped silicon layer, wherein a material of the second passivation layers and a material of the first passivation layer are different; and
performing a metallization treatment to each of the second passivation layers, to form electrodes on the second passivation layers.

17. The manufacturing method of the solar cell according to claim 6, wherein after the step of, by using the same chain-type rinsing device, performing the third corroding and rinsing treatment to the surface in the first direction and the surface in the second direction of the N-type silicon wafer after the second corroding and rinsing treatment, to remove the borosilicate-glass layer and the first phosphoro-silicate-glass layer, the manufacturing method of the solar cell further comprises:
forming a first passivation layer on the diffusion layer;
performing a passivation treatment to the first passivation layer and the doped silicon layer, to form second passivation layers on both of the first passivation layer and the doped silicon layer, wherein a material of the second passivation layers and a material of the first passivation layer are different; and
performing a metallization treatment to each of the second passivation layers, to form electrodes on the second passivation layers.

18. The manufacturing method of the solar cell according to claim 7, wherein after the step of, by using the same chain-type rinsing device, performing the third corroding and rinsing treatment to the surface in the first direction and the surface in the second direction of the N-type silicon wafer after the second corroding and rinsing treatment, to remove the borosilicate-glass layer and the first phosphoro-silicate-glass layer, the manufacturing method of the solar cell further comprises:
forming a first passivation layer on the diffusion layer;
performing a passivation treatment to the first passivation layer and the doped silicon layer, to form second passivation layers on both of the first passivation layer and the doped silicon layer, wherein a material of the second passivation layers and a material of the first passivation layer are different; and performing a metallization treatment to each of the second passivation layers, to form electrodes on the second passivation layers.

19. The manufacturing method of the solar cell according to claim 8, wherein after the step of, by using the same chain-type rinsing device, performing the third corroding and rinsing treatment to the surface in the first direction and the surface in the second direction of the N-type silicon wafer after the second corroding and rinsing treatment, to remove the borosilicate-glass layer and the first phosphorosilicate-glass layer, the manufacturing method of the solar cell further comprises:

forming a first passivation layer on the diffusion layer;

performing a passivation treatment to the first passivation layer and the doped silicon layer, to form second passivation layers on both of the first passivation layer and the doped silicon layer, wherein a material of the second passivation layers and a material of the first passivation layer are different; and performing a metallization treatment to each of the second passivation layers, to form electrodes on the second passivation layers.

20. The manufacturing method of the solar cell according to claim 9, wherein after the step of, by using the same chain-type rinsing device, performing the third corroding and rinsing treatment to the surface in the first direction and the surface in the second direction of the N-type silicon wafer after the second corroding and rinsing treatment, to remove the borosilicate-glass layer and the first phosphorosilicate-glass layer, the manufacturing method of the solar cell further comprises:

forming a first passivation layer on the diffusion layer;

performing a passivation treatment to the first passivation layer and the doped silicon layer, to form second passivation layers on both of the first passivation layer and the doped silicon layer, wherein a material of the second passivation layers and a material of the first passivation layer are different; and performing a metallization treatment to each of the second passivation layers, to form electrodes on the second passivation layers.

* * * * *